(12) United States Patent
Chuang et al.

(10) Patent No.: US 11,257,816 B2
(45) Date of Patent: Feb. 22, 2022

(54) METHOD FOR MANUFACTURING SEMICONDUCTOR DEVICE INCLUDING DUMMY GATE ELECTRODES

(71) Applicant: TAIWAN SEMICONDUCTOR MANUFACTURING CO., LTD., Hsinchu (TW)

(72) Inventors: Harry-Hak-Lay Chuang, Hsinchu County (TW); Wei-Cheng Wu, Hsinchu County (TW); Ya-Chen Kao, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/794,044

(22) Filed: Feb. 18, 2020

(65) Prior Publication Data

US 2021/0057409 A1 Feb. 25, 2021

Related U.S. Application Data

(60) Provisional application No. 62/889,442, filed on Aug. 20, 2019.

(51) Int. Cl.
*H01L 29/66* (2006.01)
*H01L 27/092* (2006.01)
*H01L 21/8238* (2006.01)
*H01L 21/321* (2006.01)

(52) U.S. Cl.
CPC .... *H01L 27/092* (2013.01); *H01L 21/823842* (2013.01); *H01L 21/3212* (2013.01); *H01L 29/66545* (2013.01)

(58) Field of Classification Search
CPC .......... H01L 29/66545; H01L 21/3212; H01L 29/66606; H01L 29/66871
See application file for complete search history.

(56) References Cited

U.S. PATENT DOCUMENTS

| | | | | |
|---|---|---|---|---|
| 2002/0050655 A1* | 5/2002 | Travis | ............... | H01L 21/31053 257/798 |
| 2003/0183860 A1* | 10/2003 | Uchiyama | ......... | H01L 21/76229 257/296 |
| 2013/0140641 A1* | 6/2013 | Chuang | ............. | H01L 21/82385 257/369 |
| 2015/0048456 A1* | 2/2015 | Chuang | ............... | H01L 27/0207 257/368 |
| 2016/0307897 A1* | 10/2016 | Shao | .................. | H01L 29/66545 |
| 2017/0194335 A1* | 7/2017 | Wu | ..................... | H01L 29/4234 |

* cited by examiner

*Primary Examiner* — Nicholas J Tobergte
*Assistant Examiner* — William Henry Anderson
(74) *Attorney, Agent, or Firm* — Maschoff Brennan

(57) ABSTRACT

A semiconductor device includes active gate structures and dummy gate electrodes. The active gate structures are above an active region of a substrate. The dummy gate electrodes are above the active region of the substrate. A number of the dummy gate electrodes is less than a number of the active gate structures. The active gate structures and the dummy gate electrodes have different materials, and a distance between adjacent one of the dummy gate electrodes and one of the active gate structures is substantially the same as a gate pitch of the active gate structures.

20 Claims, 31 Drawing Sheets

METHOD FOR MANUFACTURING SEMICONDUCTOR DEVICE INCLUDING DUMMY GATE ELECTRODES

PRIORITY CLAIM AND CROSS-REFERENCE

This application claims priority to U.S. Provisional Application Ser. No. 62/889,442, filed Aug. 20, 2019, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
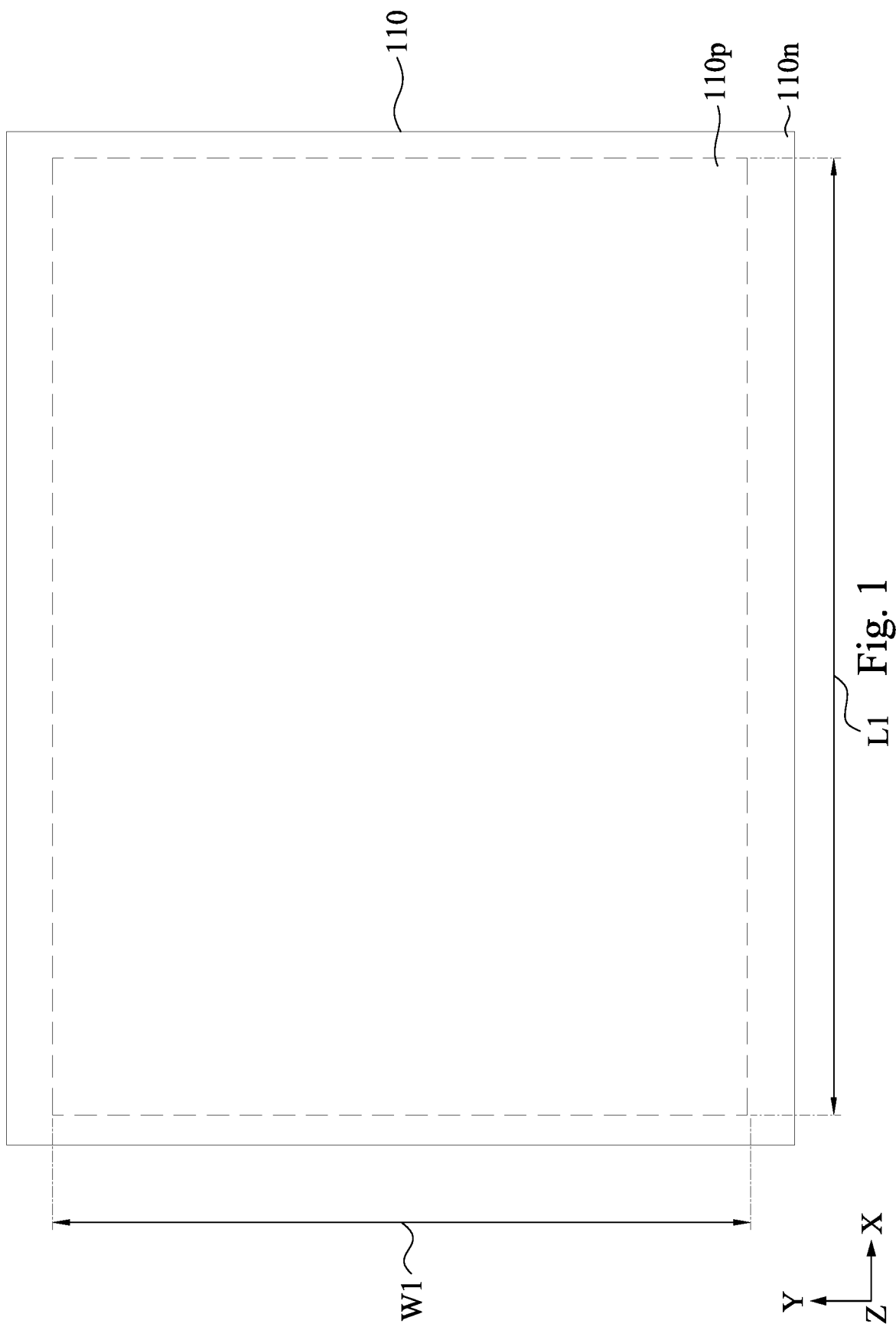
FIGS. 1-10B illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Embodiments of the present disclosure relate to semiconductor devices and methods for forming semiconductor devices with inserted dummy gates for improving dishing/erosion problems of planarization processes. These embodiments are discussed below in the context of forming planar transistors having active regions in a semiconductor substrate.

FIGS. 1-10B illustrate a method for manufacturing a semiconductor device at various stages in accordance with some embodiments of the present disclosure. Reference is made first to FIG. 1. A substrate 110 is provided. The substrate 110 includes at least one N-type region 110n and at least one P-type region 110p. At least one N-type device will be formed on the N-type region 110n, and at least one P-type device will be formed on the P-type region 110p. For ease of explanation, it is assumed that in FIGS. 1-10B, the substrate 110 includes a single one of the P-type regions 110p and a single one of the N-type regions 110n surrounding the P-type region 110p. In some embodiments, the P-type region 110p has a length L1 in an x-direction and a width W1 in a y-direction. As shown in FIG. 1, the z-direction is parallel a normal line of the substrate 110, the x-direction is the direction in which active regions 112 and 114 (see FIG. 2) extend, and the y-direction is the direction orthogonal to the z-direction and the x-direction. In some embodiments, the length L1 is greater than about 50 um, e.g., in a range of about 50 um to about 1500 um. In some embodiments, the width W1 is greater than about 50 um, e.g., in a range of about 50 um to about 1500 um.

In some embodiments, the substrate 110 may include silicon (Si). Alternatively, the substrate 110 may include germanium (Ge), silicon germanium (SiGe), gallium arsenide (GaAs) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 110 may include any of a variety of substrate structures and materials.

Figure 2:
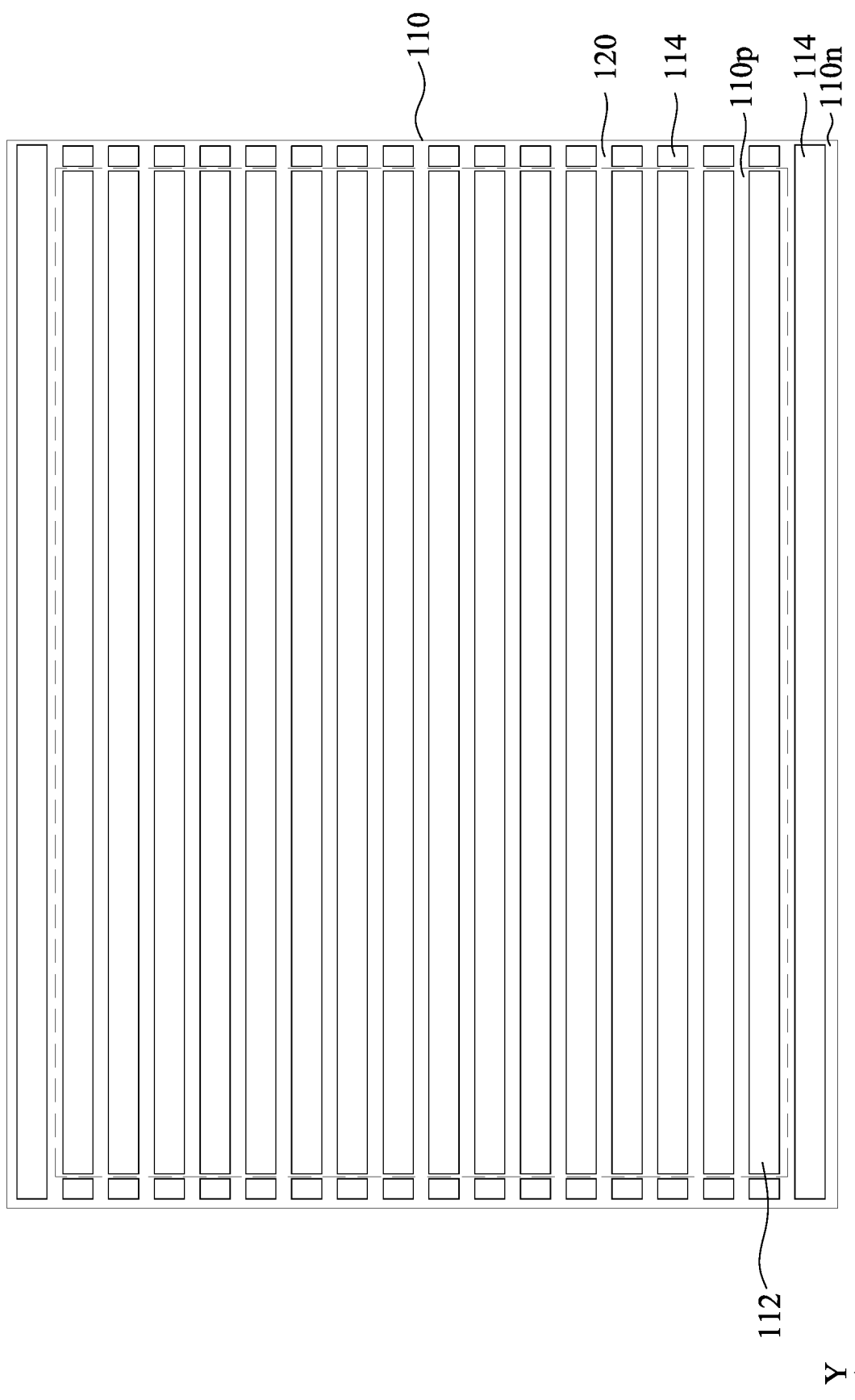

Reference is made to FIG. 2. A plurality of isolation features 120, such as shallow trench isolation (STI), are formed in the substrate 110 to separate various devices. The formation of the isolation features 120 may include etching trenches in the substrate 110 and filling the trenches by insulator materials such as silicon oxide, silicon nitride, or silicon oxynitride. The filled trench may have a multi-layer structure such as a thermal oxide liner layer with silicon nitride filling the trench. In some embodiments, the isolation features 120 may be created using a process sequence such as: growing a pad oxide, forming a low pressure chemical vapor deposition (LPCVD) nitride layer, patterning an STI opening using photoresist and masking, etching a trench in the substrate 110, optionally growing a thermal oxide trench liner to improve the trench interface, filling the trench with CVD oxide, and using chemical mechanical planarization (CMP) to remove the excessive dielectric layers.

The isolation structures 120 define active regions 112 and 114 in the substrate 110. For example, the isolation structures 120 surround the active regions 112 and 114, and the active regions 112 and 114 are separated from each other by the isolation structures 120. The active regions 112 are formed in the P-type region 110p, and the active regions 114 are formed in the N-type region 110n. It is noted that the arrangement of the active regions 112 and 114 in FIG. 2 is illustrative, and should not limit the scope of the present disclosure.

Figure 3A:
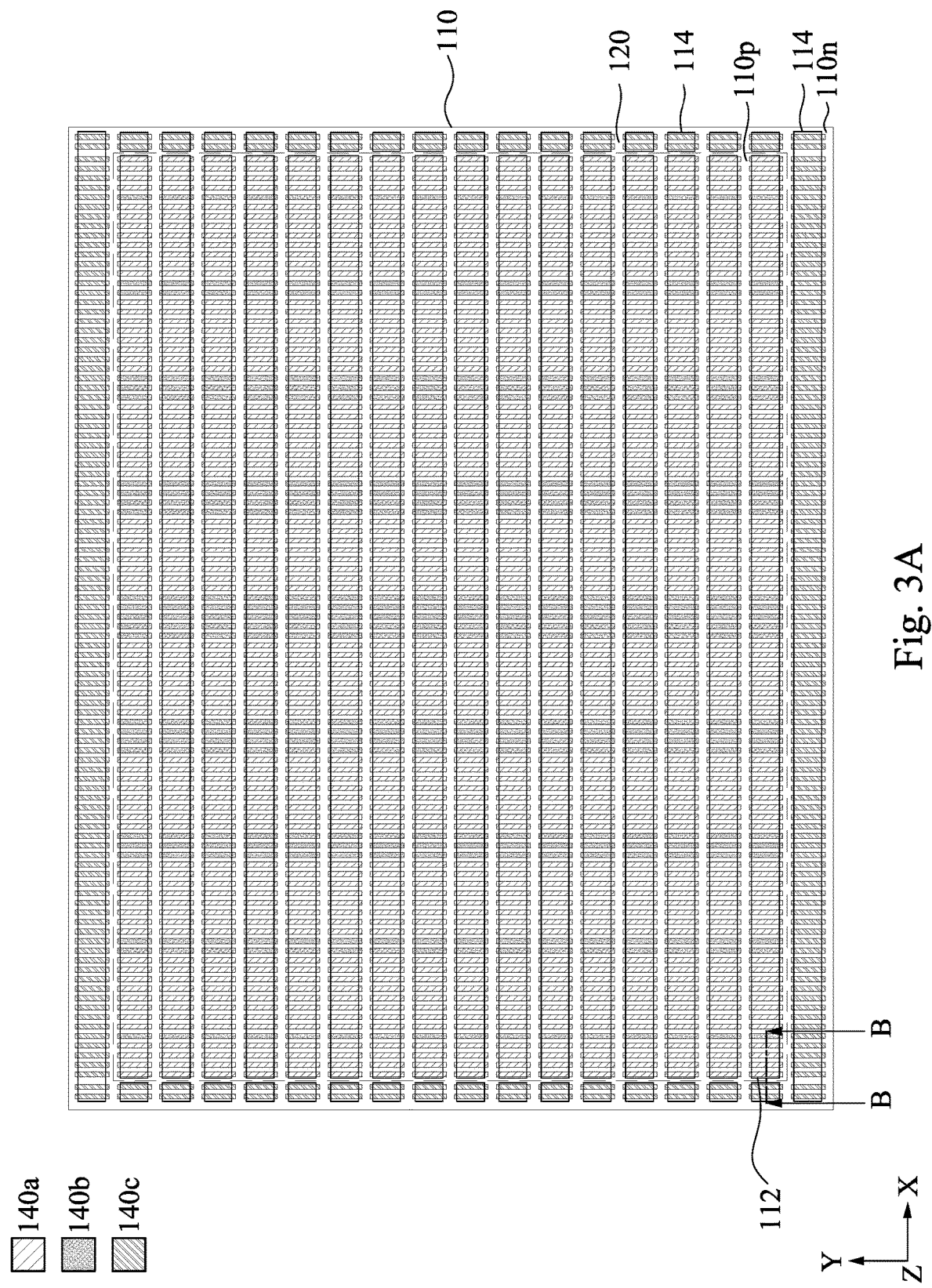
Figure 3B:
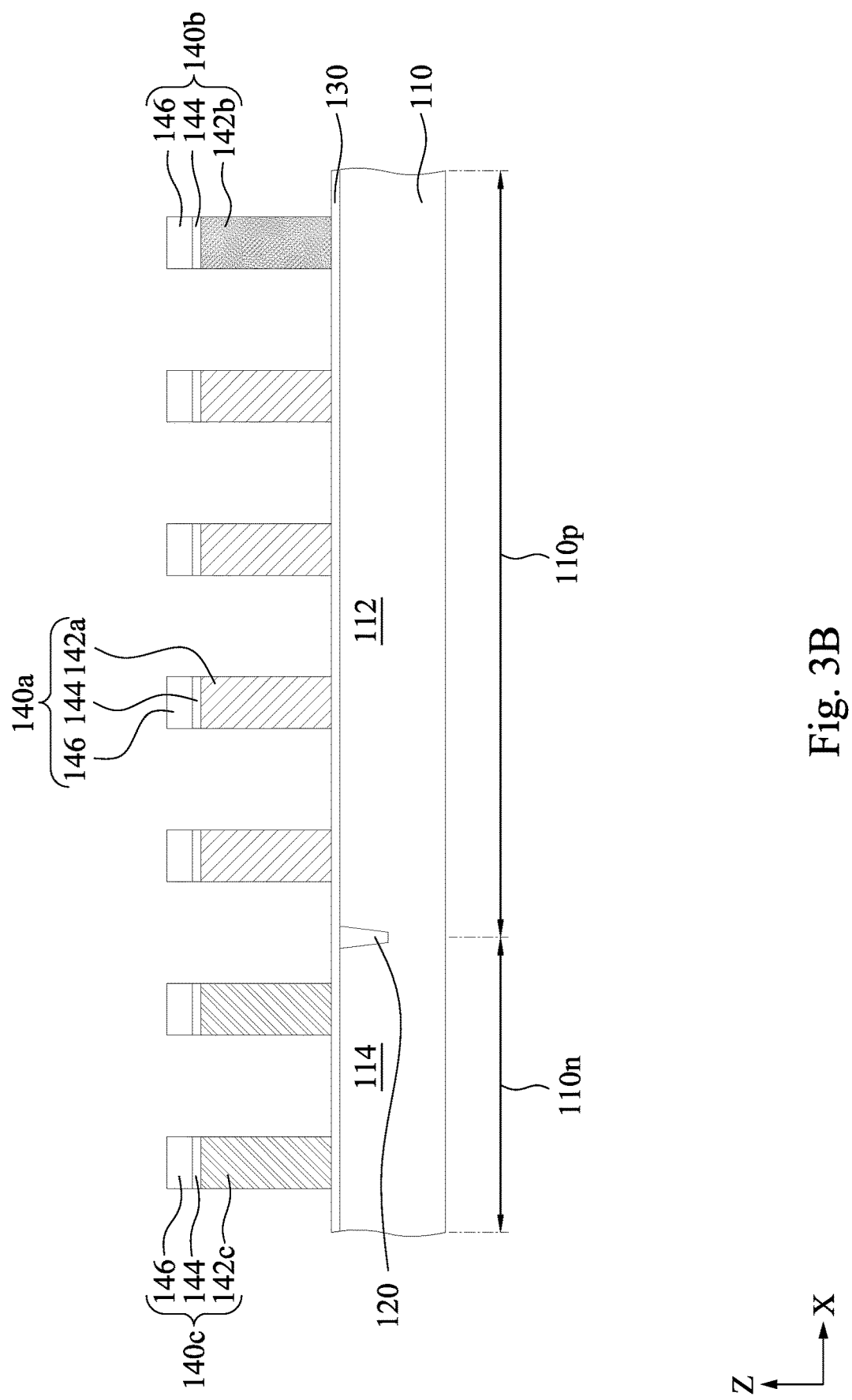

Reference is made to FIGS. 3A and 3B, where FIG. 3B is a cross-sectional view taken along line B-B in FIG. 3A. An interfacial layer 130 is formed to cover the active regions 112 and 114 (and the isolation structures 120 in some embodiments). For clarity, the interfacial layer 130 is illustrated in FIG. 3B and is omitted in FIG. 3A. In some embodiments, the interfacial layer 130 may include silicon dioxide, silicon nitride, a high-K dielectric material or other suitable material. In various examples, the interfacial layer 130 may be deposited by a chemical oxidation process, a thermal oxidation process, an ALD process, a CVD process, a subatmospheric CVD (SACVD) process, a flowable CVD process, a PVD process, or other suitable process. By way of example, the interfacial layer 130 may be used to prevent damage to the active regions 112 and 114 by subsequent processing (e.g., subsequent formation of the dummy gate structure).

Subsequently, dummy gate stacks 140a, 140b, and 140c are formed above the interfacial layer 130 and the active regions 112 and 114. The dummy gate stacks 140a and 140b are formed above the active regions 112 of the P-type region 110p, and the dummy gate stacks 140c are formed above the active regions 114 of the N-type region 110n. Each of the dummy gate stacks 140a, 140b, and 140c includes a dummy gate electrode 142a (or 142b or 142c), a pad layer 144 formed over the dummy gate electrode 142a (or 142b or 142c), and a hard mask layer 146 formed over the pad layer 144. In some embodiments, a dummy gate layer (not shown) may be formed over the interfacial layer 130, and the pad layer 144 and the hard mask layer 146 are formed over the dummy gate layer. The dummy gate layer is then patterned using the pad layer 144 and the hard mask layer 146 as masks to form the dummy gate electrode 142a-142c. As such, the dummy gate electrodes 142a, 142b, 142c, the pad layer 144, and the hard mask layer 146 are referred to as the dummy gate stacks 140a, 140b, and 140c. In some embodiments, the dummy gate electrode 142a-142c may be made of polycrystalline-silicon (poly-Si), poly-crystalline silicon-germanium (poly-SiGe), or other suitable materials. The pad layer 144 may be made of silicon dioxide or other suitable materials, and the hard mask layer 146 may be made of silicon nitride or other suitable materials. It is noted that the arrangement of the dummy gate stacks 140a, 140b, and 140c in FIGS. 3A and 3B is illustrative, and should not limit the scope of the present disclosure. The arrangement of the dummy gate stacks 140a and 140b will be described in detail in FIGS. 7A and 7B.

Figure 4A:
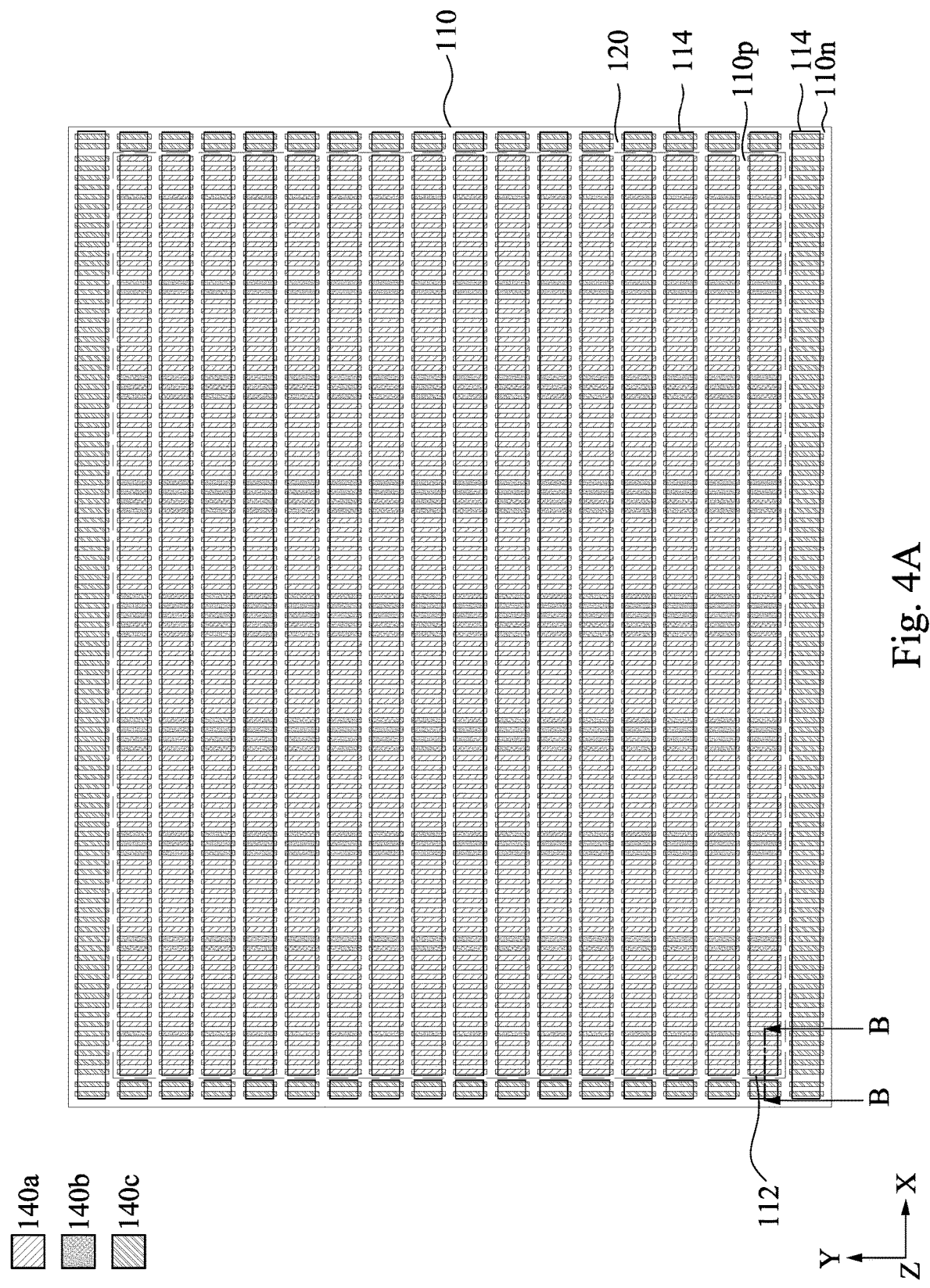
Figure 4B:
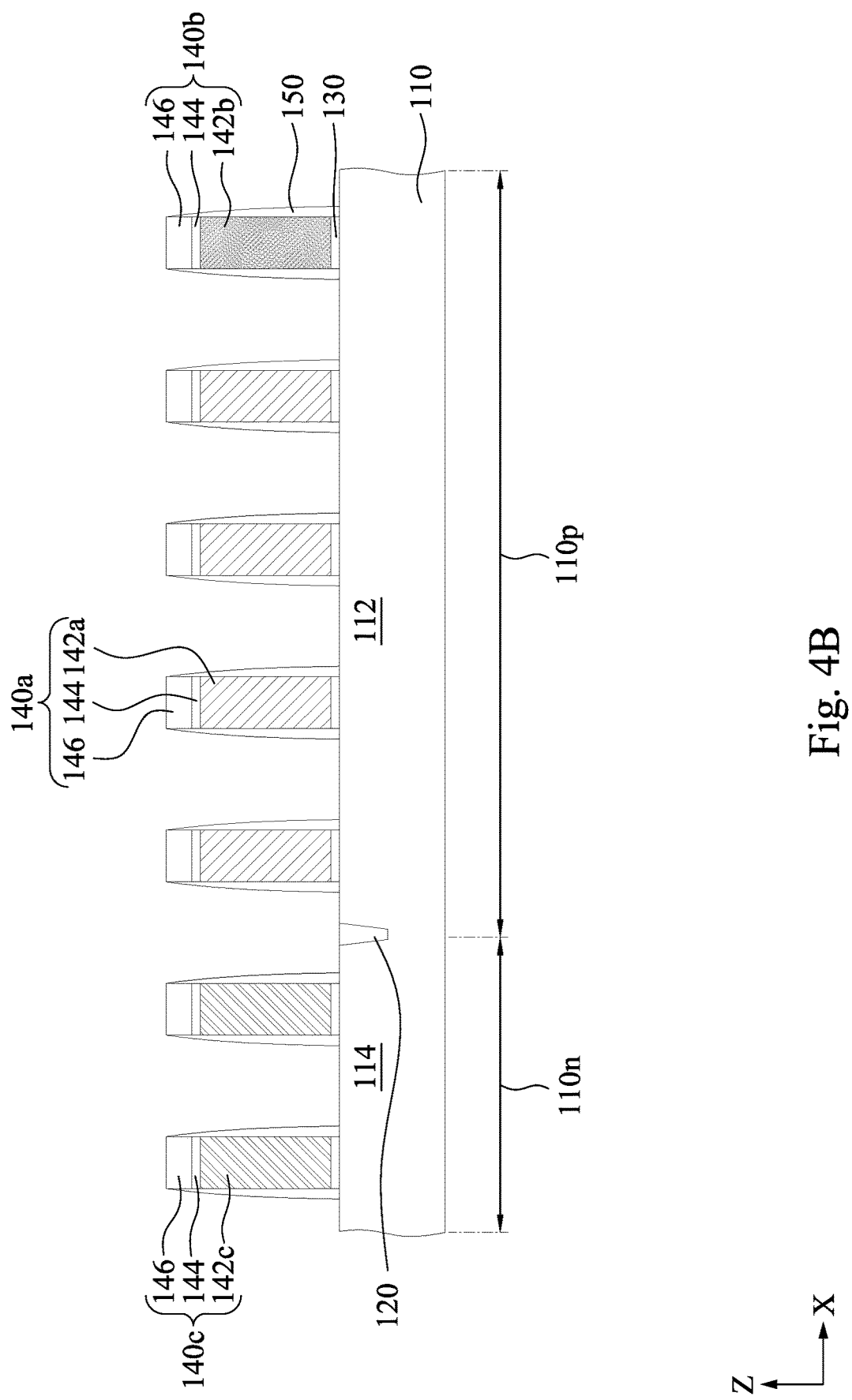

Reference is made to FIGS. 4A and 4B, where FIG. 4B is a cross-sectional view taken along line B-B in FIG. 4A. Portions of the interfacial layer 130 uncovered by the dummy gate stacks 140a, 140b, and 140c are removed to expose the active regions 112 and 114. Spacer structures 150 are then formed at least on opposite sides of the dummy gate stacks 140a, 140b, and 140c. For clarity, the spacer structures 150 are illustrated in FIG. 4B and are omitted in FIG. 4A. The spacer structures 150 may include a seal spacer and a main spacer (not shown). The spacer structures 150 include one or more dielectric materials, such as silicon oxide, silicon nitride, silicon oxynitride, SiCN, $SiC_xO_yN_z$, or combinations thereof. The seal spacers are formed on sidewalls of the dummy gate stack 140a, 140b, and 140c and the main spacers are formed on the seal spacers. The spacer structures 150 can be formed using a deposition method, such as plasma enhanced chemical vapor deposition (PECVD), low-pressure chemical vapor deposition (LPCVD), sub-atmospheric chemical vapor deposition (SACVD), or the like. The formation of the spacer structures 150 may include blanket forming spacer layers and then performing etching operations to remove the horizontal portions of the spacer layers. The remaining vertical portions of the spacer layers form the spacer structures 150.

Figure 5A:
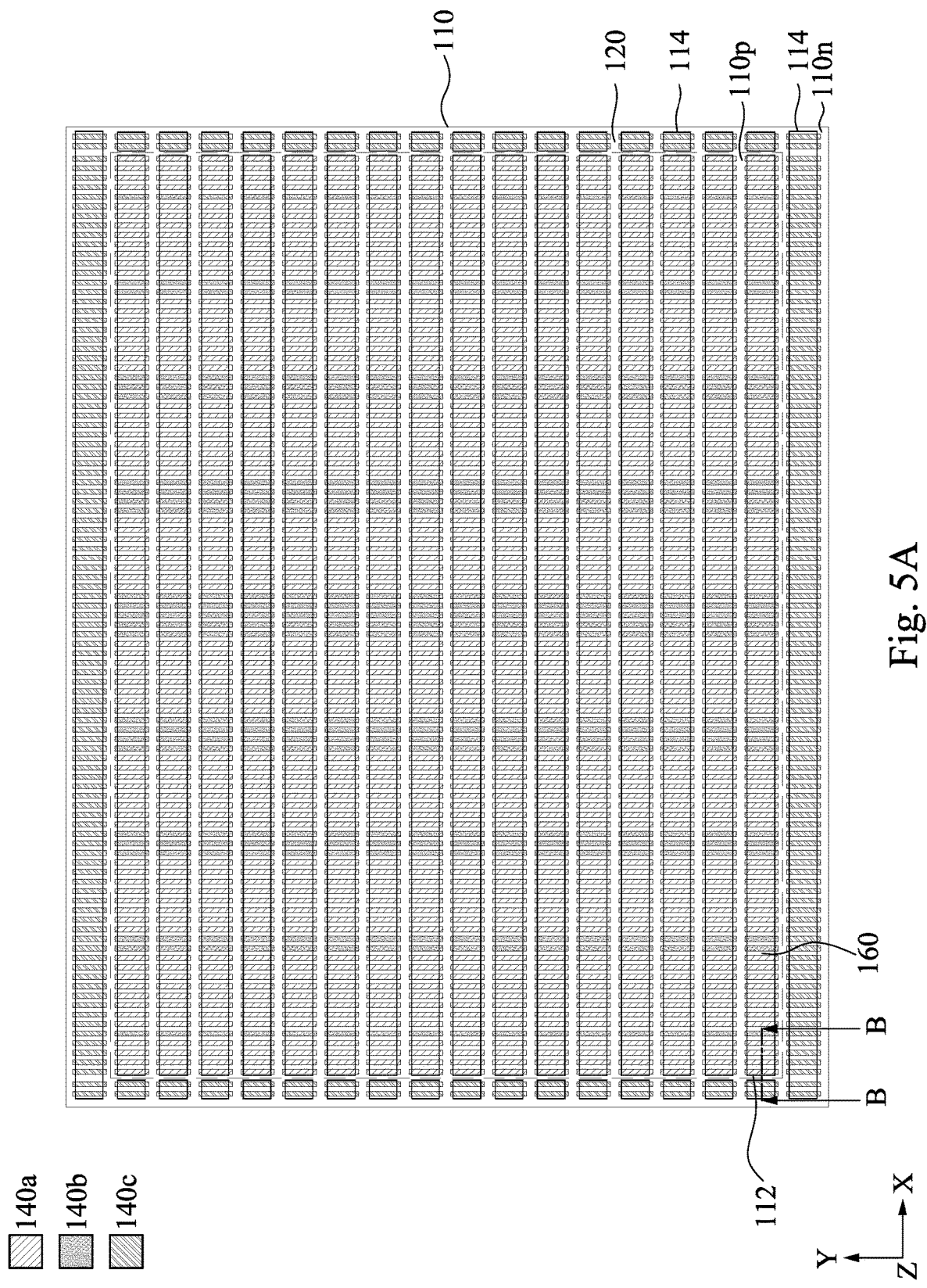
Figure 5B:
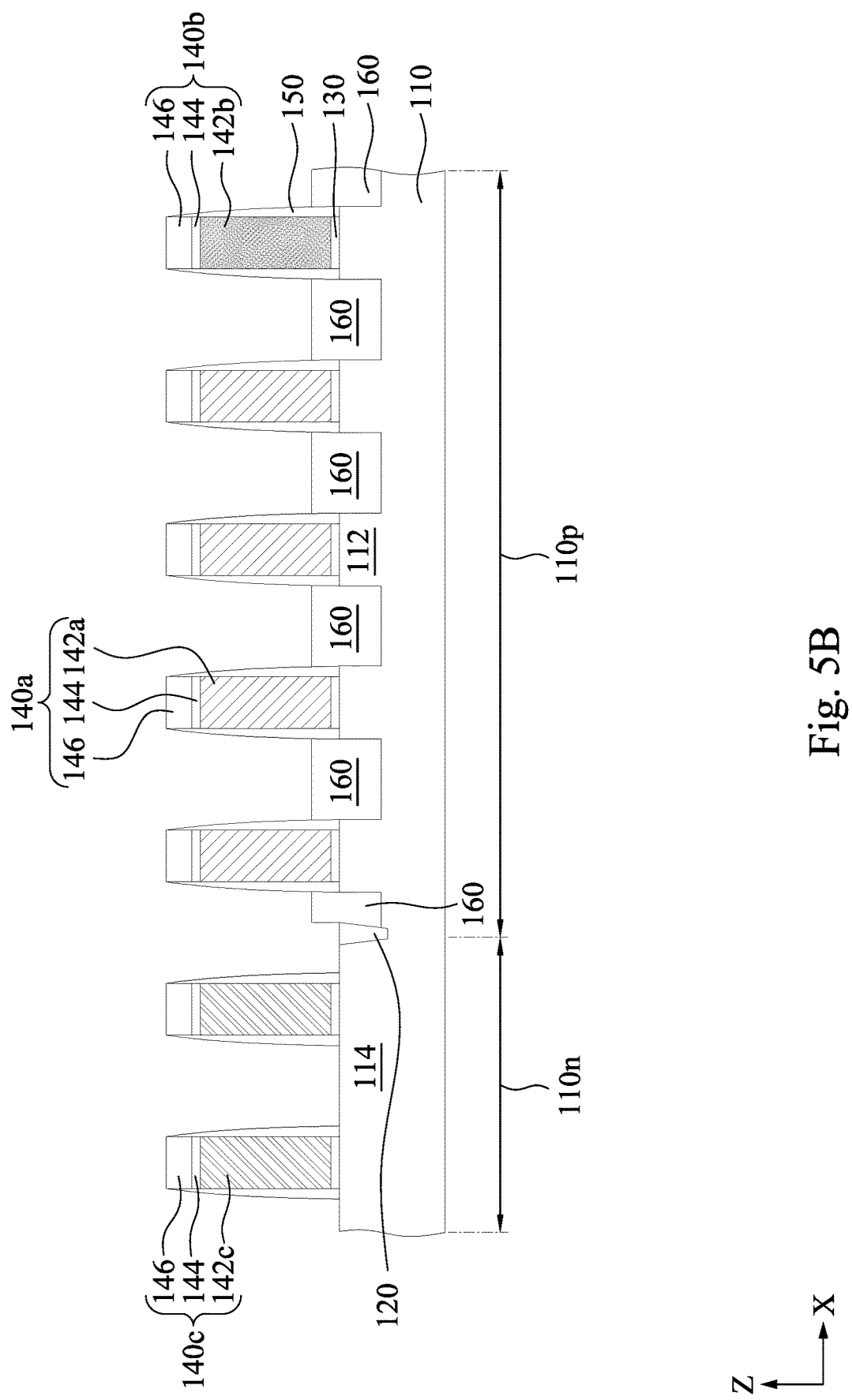

Reference is made to FIGS. 5A and 5B, where FIG. 5B is a cross-sectional view taken along line B-B in FIG. 5A. Epitaxial structures 160 are formed on portions of the active regions 112 of the p-type region 110p which are uncovered by the dummy gate stacks 140a, 140b and the spacer structures 150 by performing, for example, a selectively growing process. The epitaxial structures 160 are formed by epitaxially growing a semiconductor material. The semiconductor material includes single element semiconductor material, such as germanium (Ge) or silicon (Si), compound semiconductor materials, such as gallium arsenide (GaAs) or aluminum gallium arsenide (AlGaAs), or semiconductor alloy, such as silicon germanium (SiGe) or gallium arsenide phosphide (GaAsP). The epitaxial structures 160 have suitable crystallographic orientations (e.g., a (100), (110), or (111) crystallographic orientation). In some embodiments, the epitaxial structures 160 include source/drain epitaxial structures. In some embodiments, where P-type devices are desired, the epitaxial structures 160 may include an epitaxially growing silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes.

In some embodiments, source/drain regions are formed in portions of the active regions 114 of the n-type region 110n and uncovered by the dummy gate stacks 140c and the spacer structures 150. For example, an implantation process can be performed to dope the portions of the active regions 114 of the n-type region 110n. The dopants may be n-type dopants.

Figure 6A:
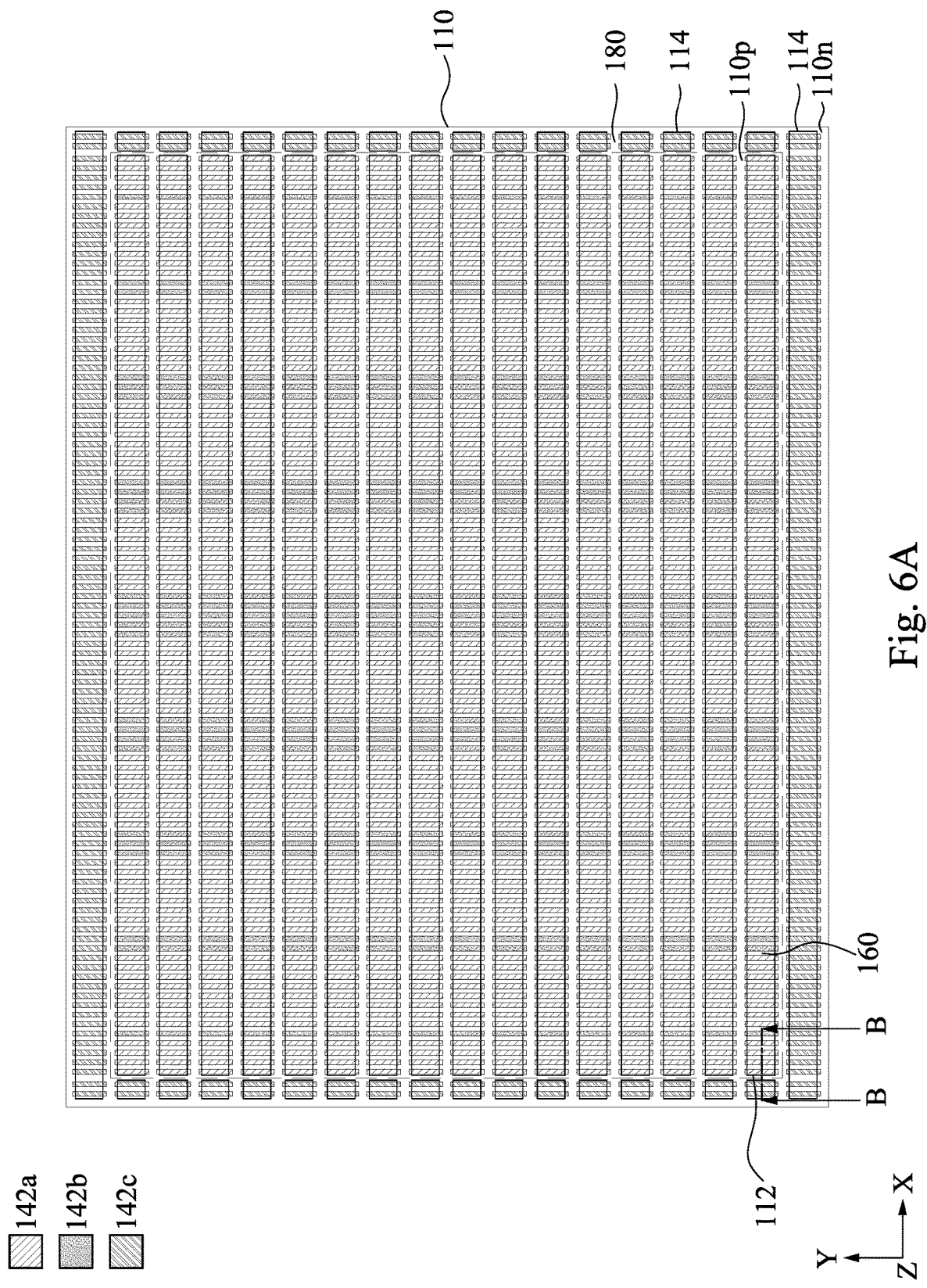
Figure 6B:
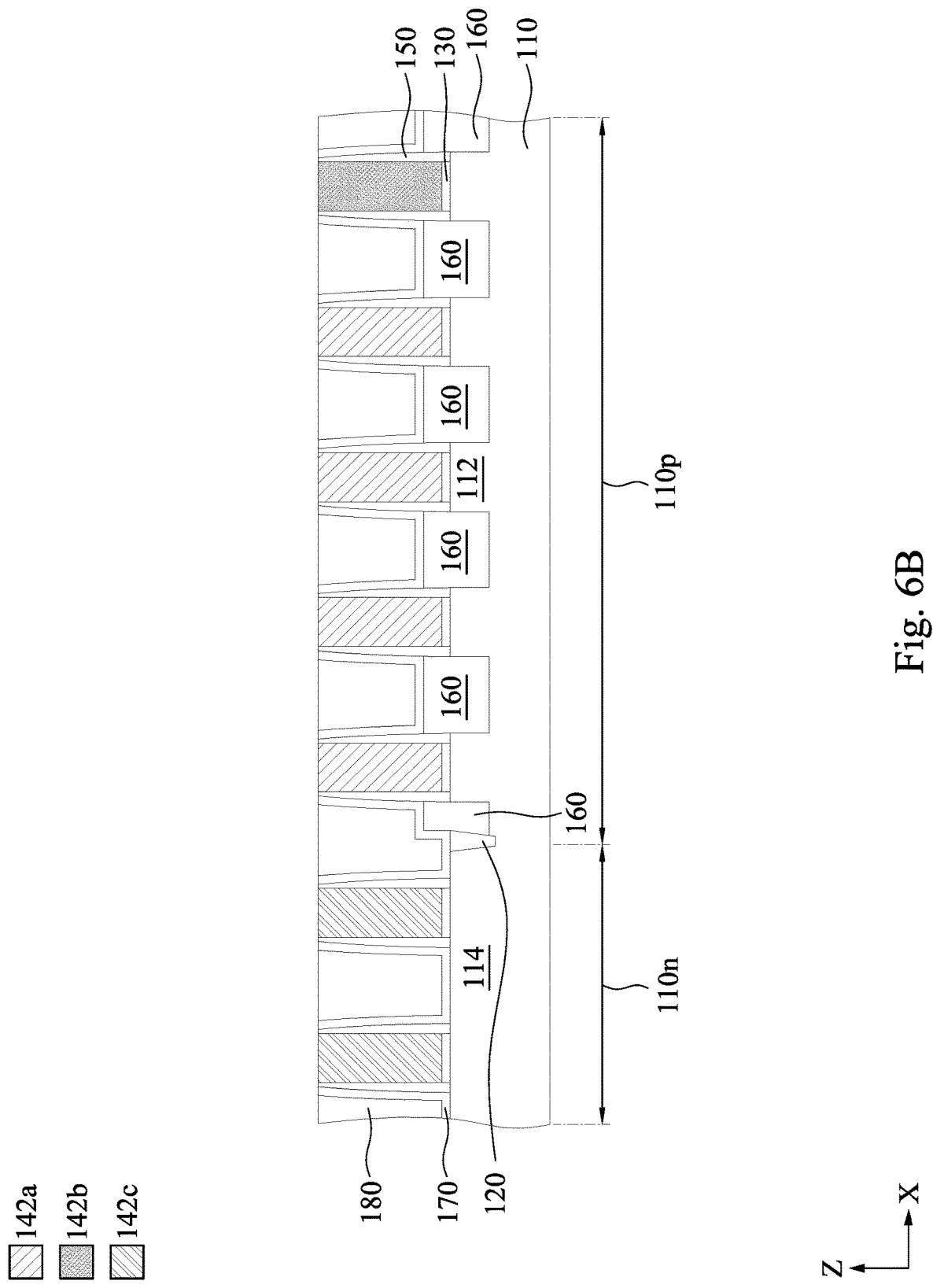

Reference is made to FIGS. 6A and 6B, where FIG. 6B is a cross-sectional view taken along line B-B in FIG. 6A. A contact etch stop layer (CESL) 170 is conformally formed over the structure of FIGS. 5A and 5B. For clarity, the CESL 170 are illustrated in FIG. 6B and are omitted in FIG. 6A. In some embodiments, the CESL 170 can be a stressed layer or layers. In some embodiments, the CESL 170 has a tensile stress and is formed of $Si_3N_4$. In some other embodiments, the CESL 170 includes materials such as oxynitrides. In yet some other embodiments, the CESL 170 may have a composite structure including a plurality of layers, such as a silicon nitride layer overlying a silicon oxide layer. The CESL 170 can be formed using plasma enhanced CVD (PECVD), however, other suitable methods, such as low pressure CVD (LPCVD), atomic layer deposition (ALD), and the like, can also be used.

An interlayer dielectric (ILD) 180 is then formed on the CESL 170. The ILD 180 may be formed by chemical vapor deposition (CVD), high-density plasma CVD, spin-on, sputtering, or other suitable methods. In some embodiments, the first ILD 180 includes silicon oxide. In some other embodiments, the ILD 180 may include silicon oxy-nitride, silicon nitride, or a low-k material. Subsequently, a planarization process (such as a chemical mechanical planarization (CMP) process) is performed to level the top surface of the ILD 180 with the top surface of the dummy gate electrodes 142a, 142b, and 142c. That is, the dummy gate electrodes 142a, 142b, and 142c are exposed from the ILD 180. In some other embodiments, the planarization process level the top surface of the ILD 180 with the top surface of the hard mask layer 146.

Figure 7A:
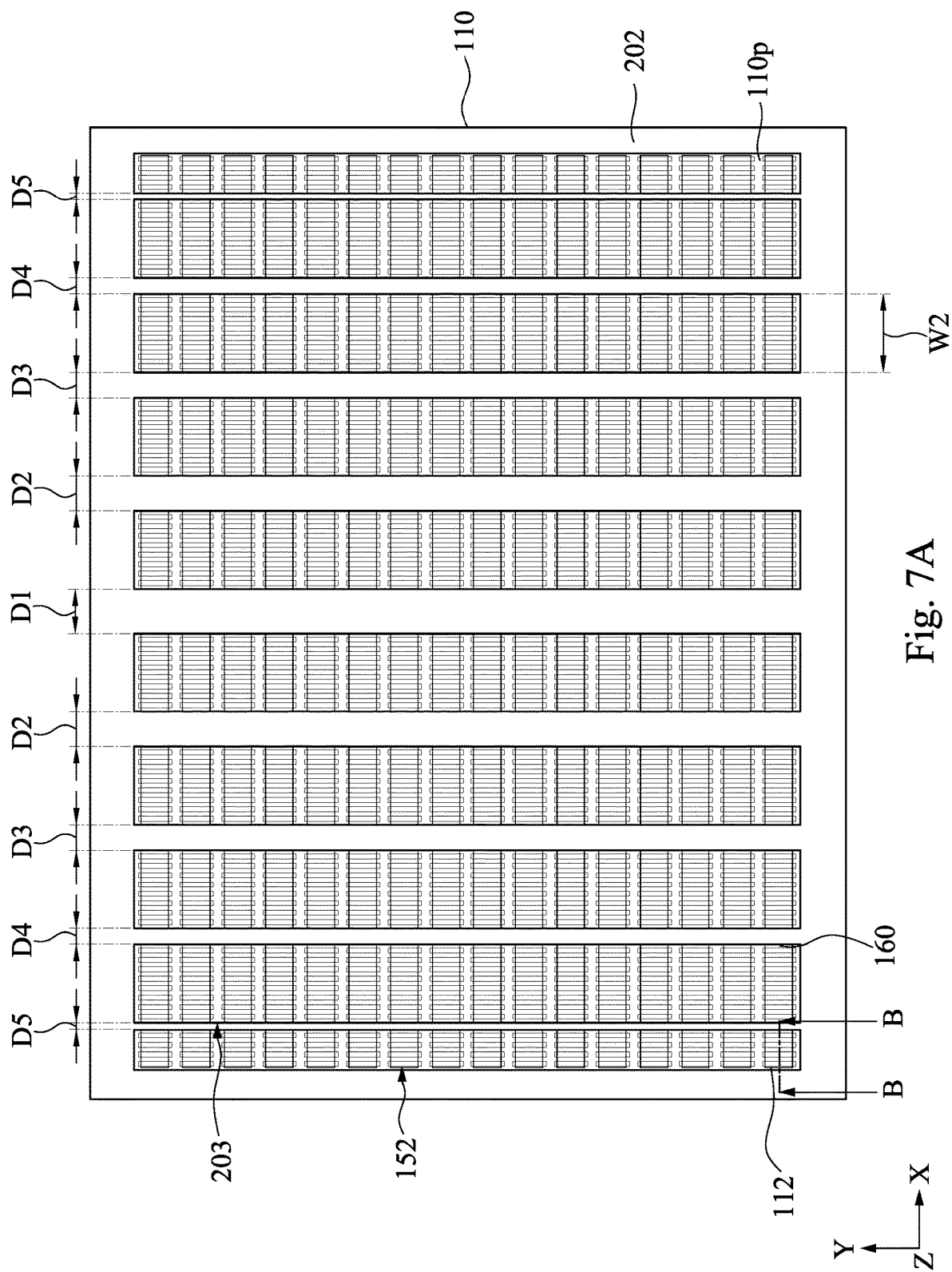
Figure 7B:
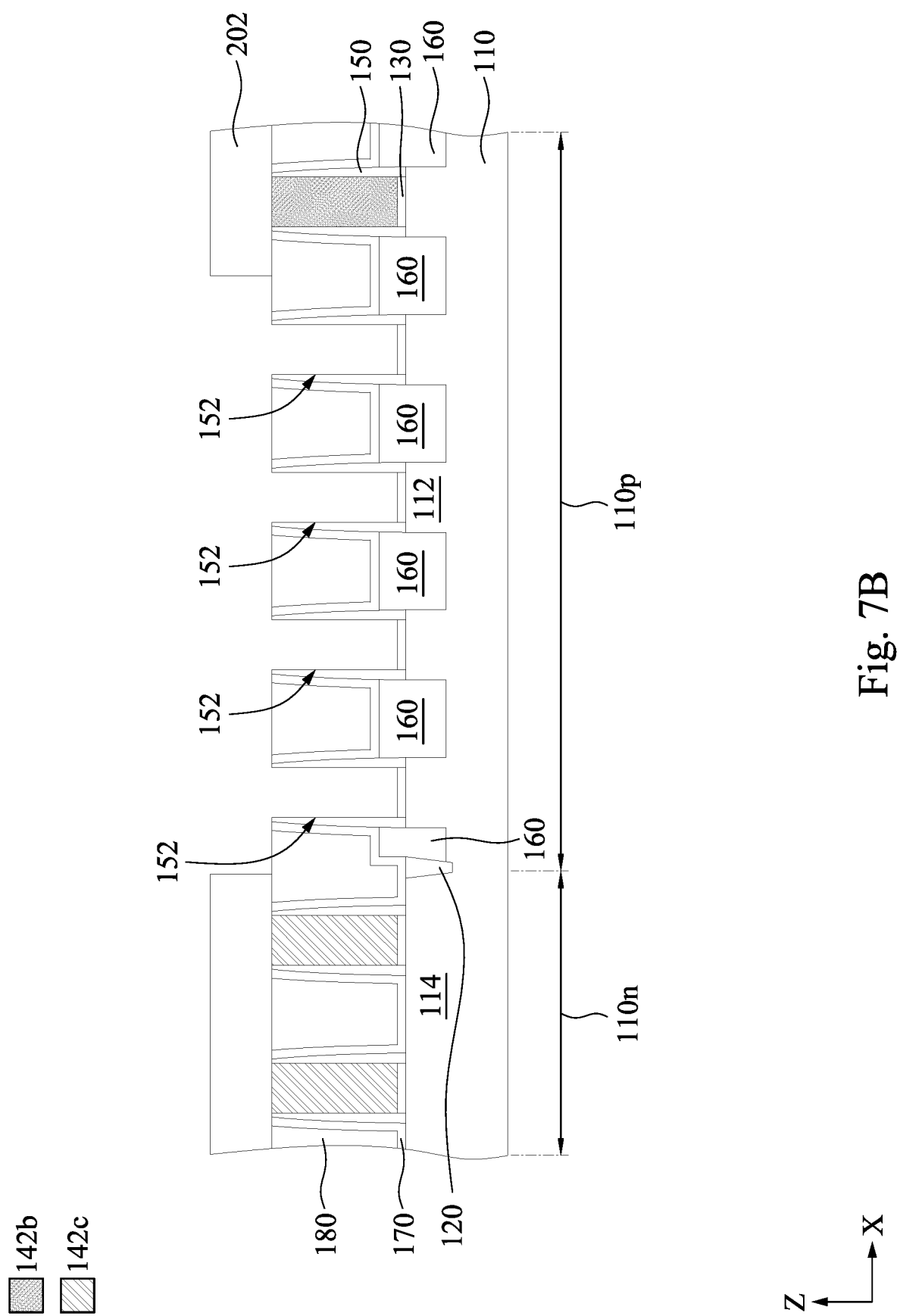

Reference is made to FIGS. 7A and 7B, where FIG. 7B is a cross-sectional view taken along line B-B in FIG. 7A. A first replacement gate (RPG) process scheme for P-type devices is employed. In the first RPG process scheme, a dummy polysilicon gate (the dummy gate electrodes 142a of FIGS. 6A-6B in this case) is formed in advance and is replaced later by a metal gate. Specifically, a mask layer is formed over the structure of FIGS. 6A and 6B, and the mask layer is patterned to form a patterned mask layer 202. The patterned mask layer 202 exposes the dummy gate electrodes 142a but covers the dummy gate electrodes 142b and 142c. That is, the first RPG process replaces the dummy gate electrodes 142a with metal gate structures.

Subsequently, the dummy gate electrodes 142a are removed to respectively form openings 152 with the spacer structures 150 as their sidewalls. The dummy gate electrodes 142a may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 8A:
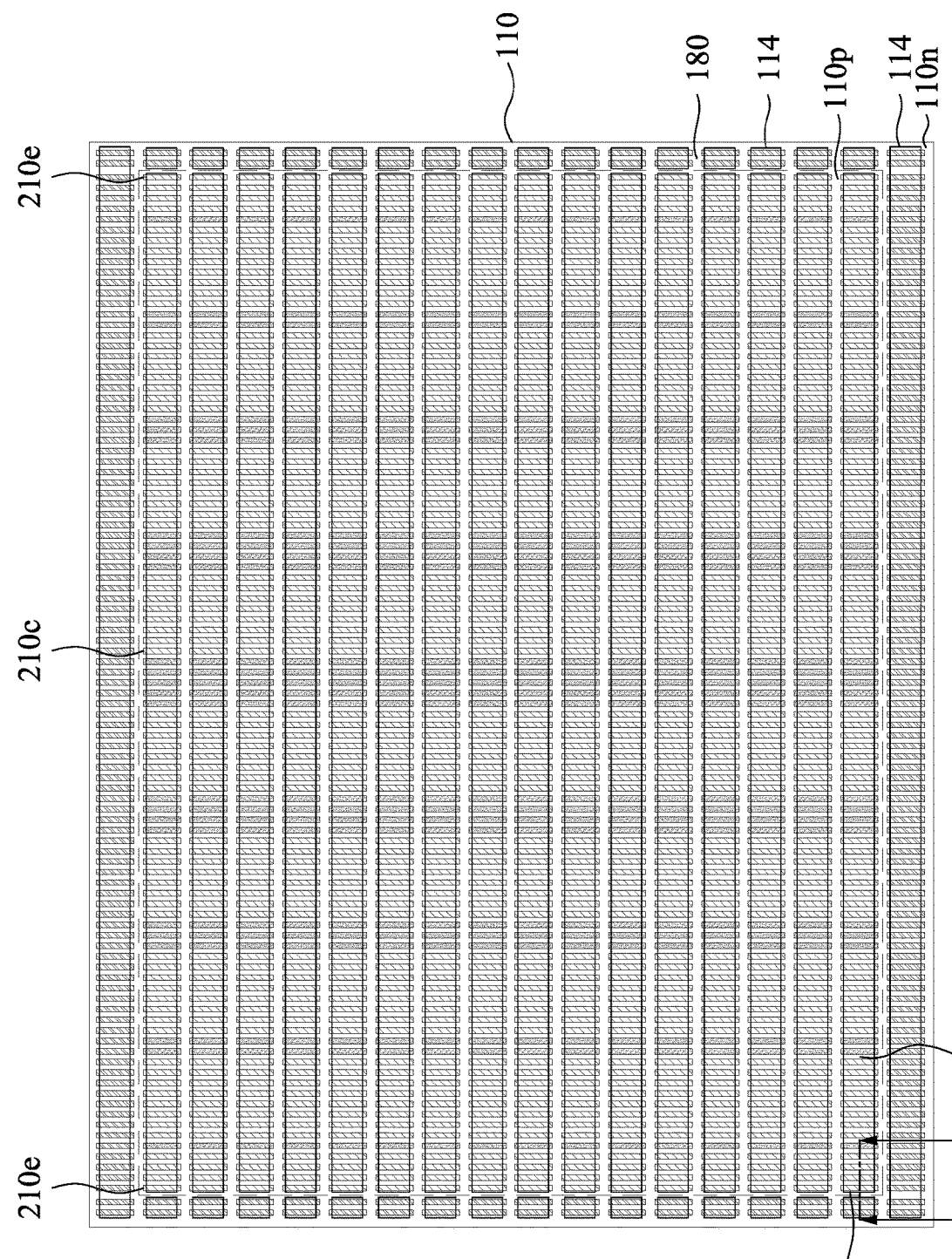
Figure 8B:
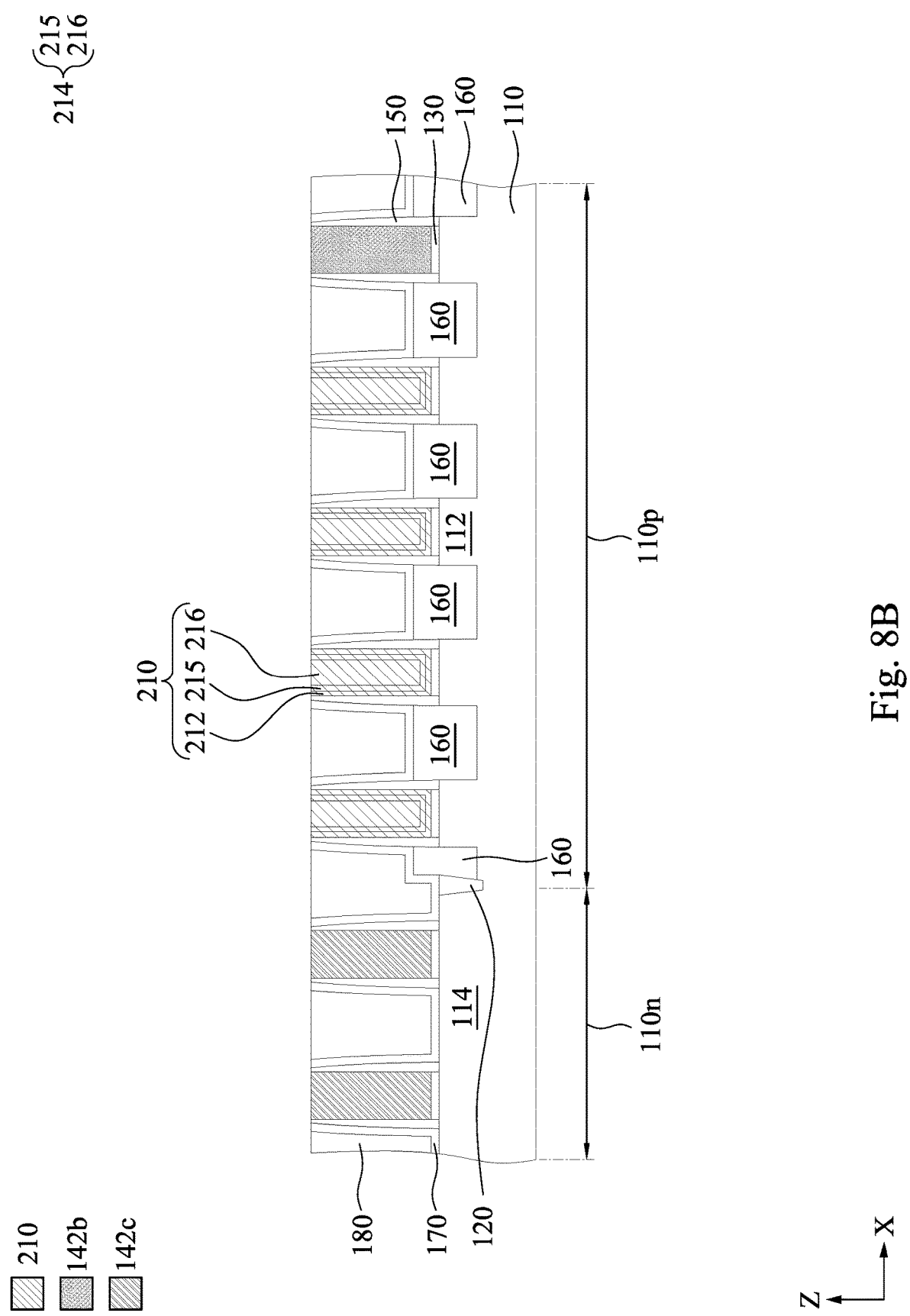

Reference is made to FIGS. 8A and 8B, where FIG. 8B is a cross-sectional view taken along line B-B in FIG. 8A. The patterned mask layer 202 in FIGS. 7A and 7B is then removed, and the removal method may be performed by etching, solvent stripping, and/or plasma ashing, for example. A gate dielectric layer 212 is then formed in the openings 152, and at least one metal layer is formed in the openings 152 and on the gate dielectric layer 212. Subsequently, a chemical mechanical planarization (CMP) process is performed to planarize the metal layer and the gate dielectric layer 212 to form metal gate stacks 210 respectively in the openings 152. The metal gate structures 210 cross over the active regions 112 of the P-type regions 110p. Each of the metal gate structures 210 includes the gate dielectric layer 212 and a metal gate electrode 214 over the gate dielectric layer 212. The metal gate electrode 214 may include metal layers 215, e.g., work function metal layer(s) and capping layer(s), a fill layer(s) 216, and/or other suitable layers that are desirable in a metal gate stack. The work function metal layer may include p-type work function metal. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. The work function metal layer may have multiple layers. The work function metal layer(s) may be deposited by CVD, PVD, electroplating and/or other suitable process. In some embodiments, the capping layer in the metal gate electrodes may include refractory metals and their nitrides (e.g. TiN, TaN, $W_2N$, TiSiN, TaSiN). The capping layer may be deposited by PVD, CVD, metal-organic chemical vapor deposition (MOCVD) ALD, or the like. In some embodiments, the fill layer 216 in the metal gate electrodes may include tungsten (W). The fill layer 216 may be deposited by ALD, PVD, CVD, or other suitable process. In some embodiments, the metal gate electrode is a p-type metal gate including a p-type work function metal layer, such that the metal gate structures 210 may be referred to as P-type metal gate structures 210.

The CMP process removes metals in the first RPG process. Since CMP process involves using polishing pads, which could bend and result in dishing/erosion of large metal areas (such as the area above the P-type region 110p). Due to the large array of the P-type metal gate structures 210, severe dishing may occur to result in significant loss of the fill layer 216 and the metal layers 215. The P-type metal gate structures 210 above the center of the P-type region 110p suffer more loss. Such varying degree of loss of the P-type metal gate structures 210 makes gate resistance and work function of the P-type metal gate structures 210 unpredictable.

In FIGS. 7A and 7B, however, the dummy gate electrodes 142b are inserted above the P-type region 110p and among the P-type metal gate structures 210 (or the dummy gate electrodes 142a). The dummy gate electrodes 142b are used to form dummy devices, which are tied to ground or supply and not expected to function. The CMP process has a low removing rate with respect to the dummy gate electrodes 142b, such that the dummy gate electrodes 142b improves the mechanical strength above the P-type region 110p, and the CMP dishing/erosion effect is reduced.

In some embodiments, the CMP dishing effect decreases with the increasing numbers of the dummy gate electrodes 142b. For example, in FIGS. 8A and 8B, more than one, such as 2, 3, or more, dummy gate electrodes 142b may be inserted between two neighboring P-type metal gate structures 210. For example, since the area above the center of the P-type region 110p suffer more loss, more dummy gate electrodes 142b can be inserted above the center of the P-type region 110p.

In some embodiments, the insertion of dummy gate stacks 140b could also vary with the location of the analog devices. As shown in FIG. 8A, the edge metal gate structures, such as 210e, suffer from dishing/erosion effect differently from center metal gate structures, such as 210c. The number of the dummy gate electrodes 142b could be fewer near the edge metal gate structures 210e than between the center metal gate structures 210c. The number of dummy gate electrodes 142b can be different between metal gate structures 210.

The patterning of the mask layer 202 determines the arrangement of the dummy gate electrodes 142b. For example, in FIG. 7A, the patterned mask layer 202 has a plurality of openings 203. In some embodiments, each of the openings 203 has a width W2 in a range of about 5 um to about 30 um. The distance between neighboring openings 203 may be different. In some embodiments, the distance at the center of the P-type region 110p is greater than the distance at the edge of the P-type region 110p. For example, the distance D1 is greater than the distance D2, the distance D2 is greater than the distance D3, the distance D3 is greater than the distance D4, and/or the distance D4 is greater than the distance D5. Each of the distances D1-D5 is in a range of about 0.16 um to about 5 um. If the distance D1 (or D2 or D3 or D4 or D5) is less than about 0.16 um, the metal loss issue still remains; if the distance D1 (or D2 or D3 or D4 or D5) is greater than about 5 um, the electrically efficiency of the semiconductor device is reduced (since there are too many dummy gate electrodes 142b among the P-type metal gate structures 210).

Figure 9A:
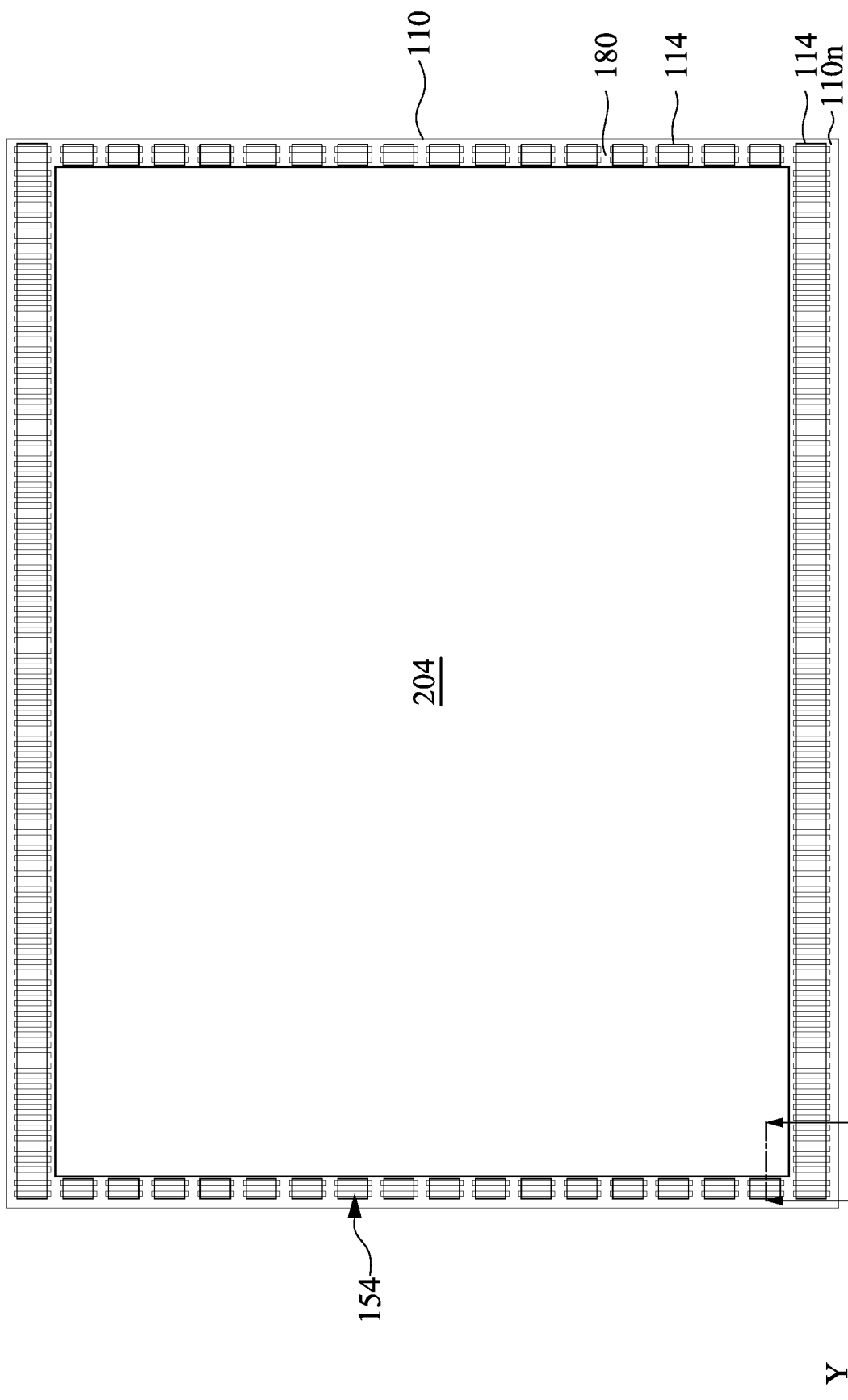
Figure 9B:
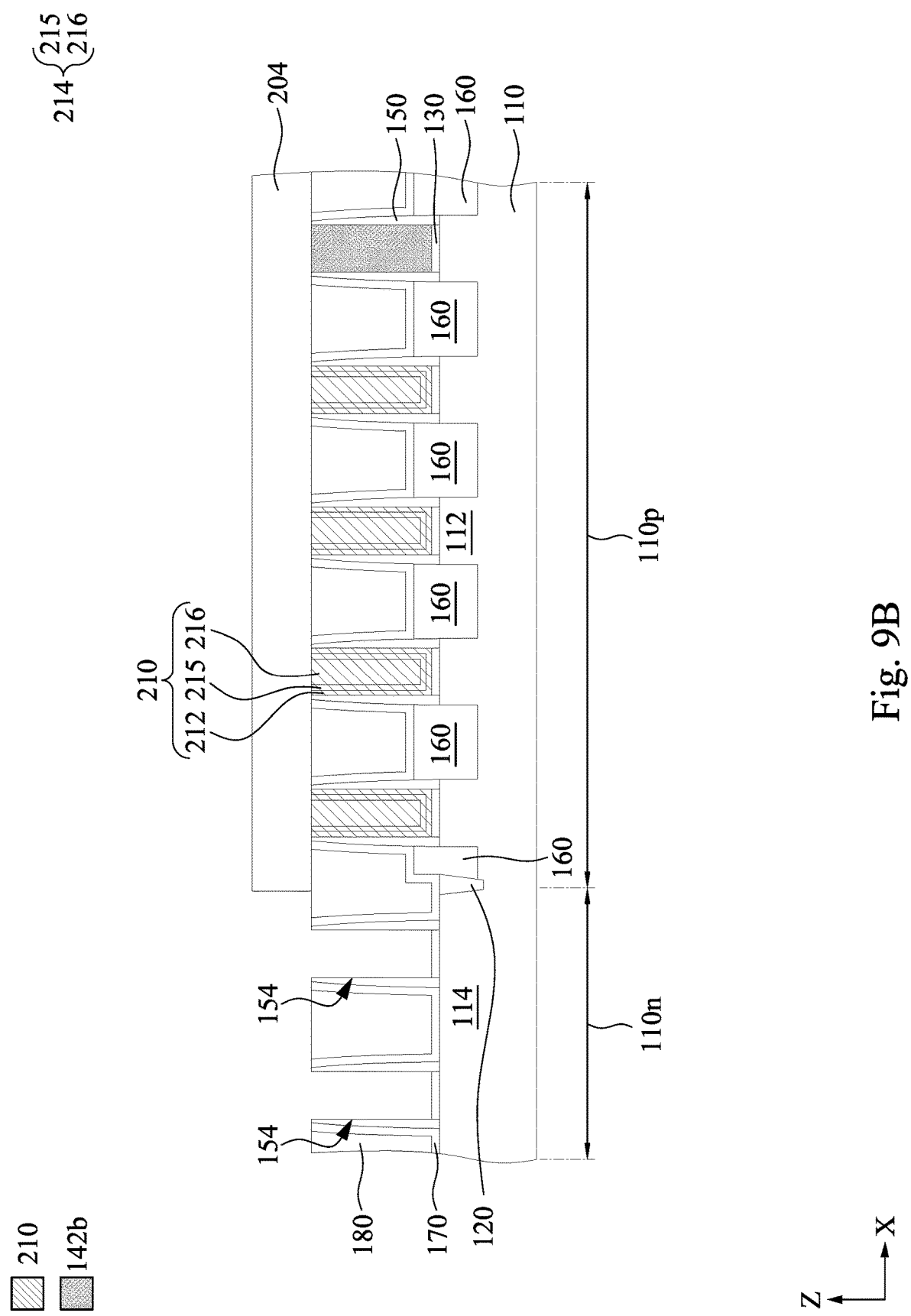

Reference is made to FIGS. 9A and 9B, where FIG. 9B is a cross-sectional view taken along line B-B in FIG. 9A. A second RPG process scheme for N-type devices is employed. Specifically, another mask layer is formed over structure of FIGS. 8A and 8B, and the mask layer is patterned to form a patterned mask layer 204. The patterned mask layer 204 exposes the dummy gate electrodes 142c but covers the dummy gate electrodes 142b and the P-type metal gate structures 210. That is, the second RPG process replaces the dummy gate electrodes 142c with metal gate structures.

Subsequently, the dummy gate electrodes 142c are removed to respectively form openings 154 with the spacer structures 150 as their sidewalls. The dummy gate electrodes 142c may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 10A:
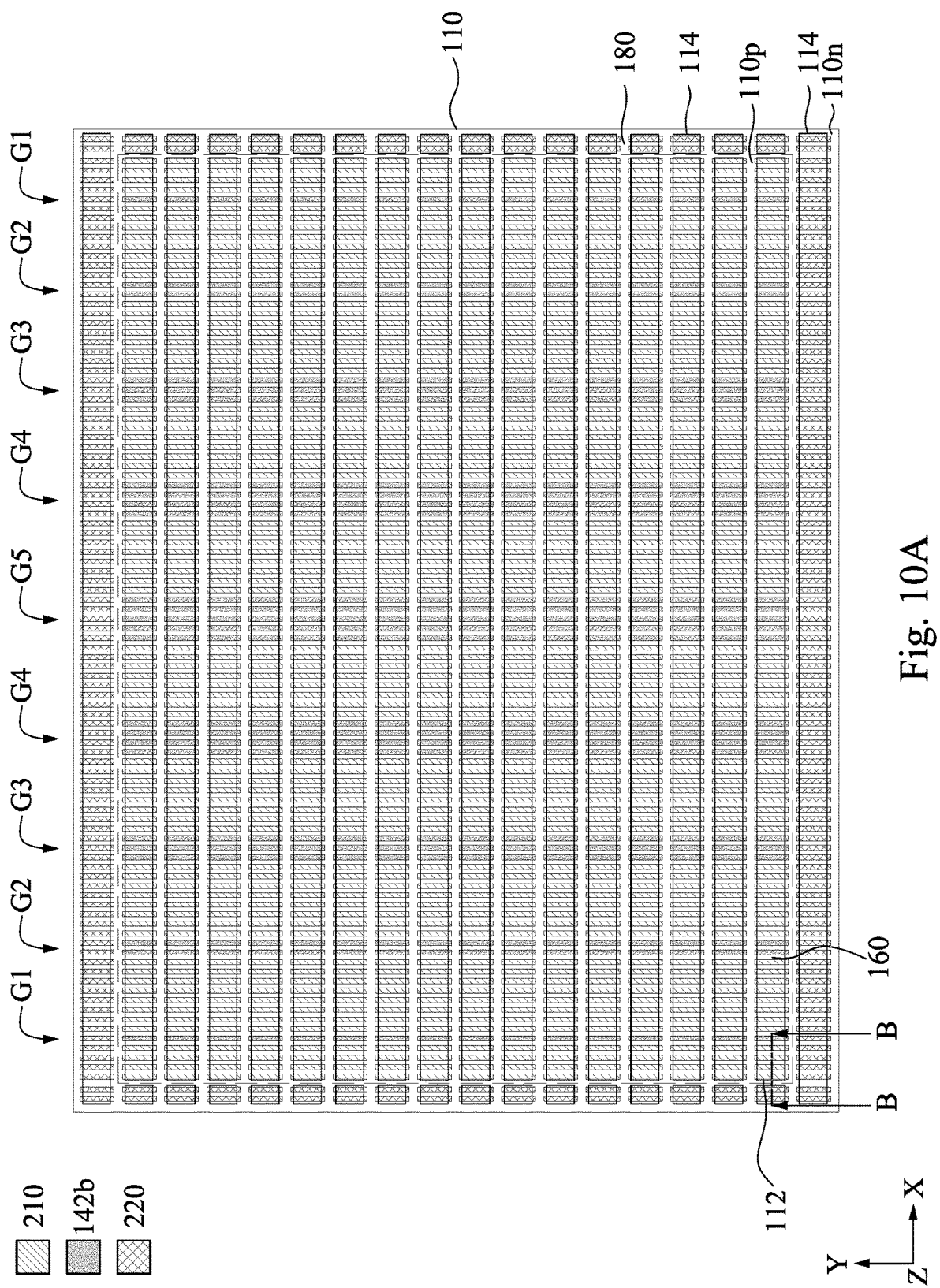
Figure 10B:
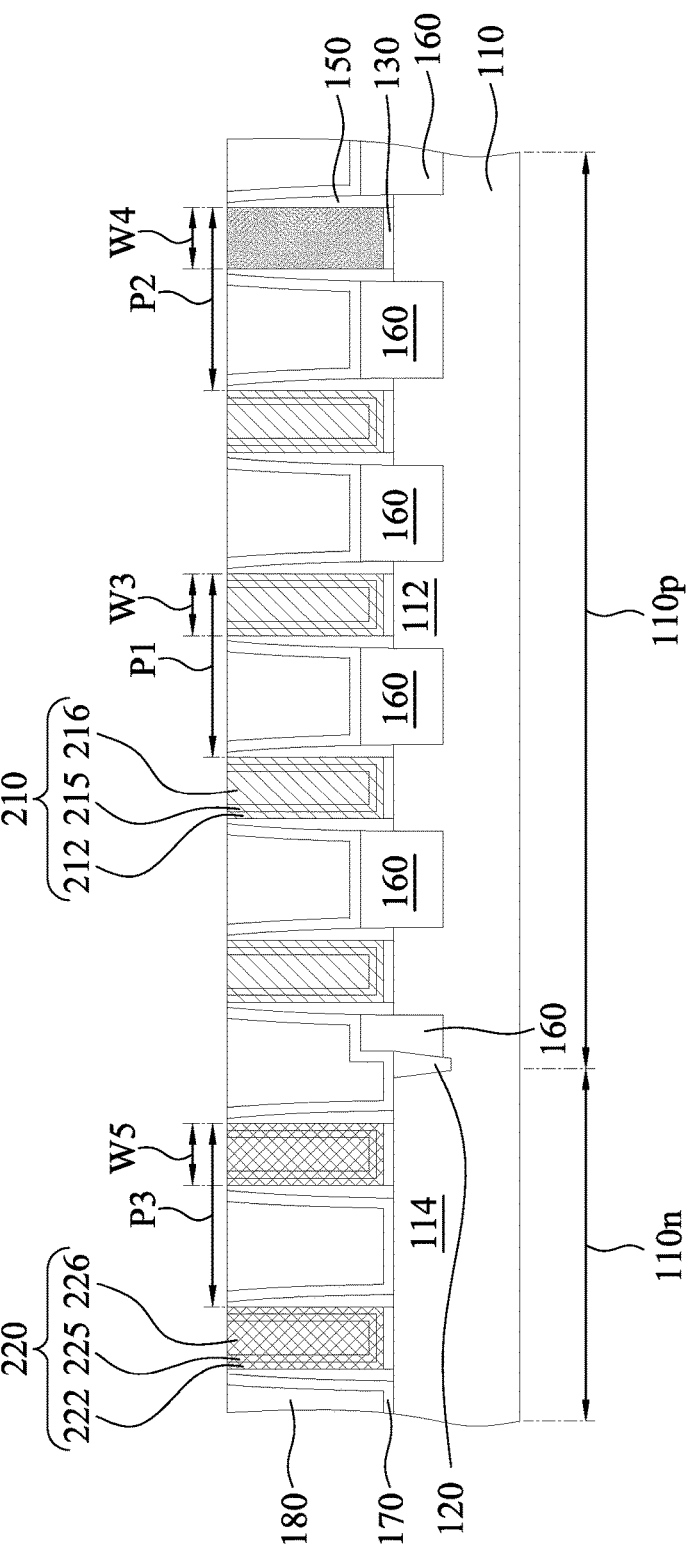

Reference is made to FIGS. 10A and 10B, where FIG. 10B is a cross-sectional view taken along line B-B in FIG. 10A. The patterned mask layer 204 in FIGS. 9A and 9B is then removed, and the removal method may be performed by etching, solvent stripping, and/or plasma ashing, for example. A gate dielectric layer 222 is then formed in the openings 154, and at least one metal layer is formed in the openings 154 and on the gate dielectric layer 222. Subsequently, a chemical mechanical planarization (CMP) process is performed to planarize the metal layer and the gate dielectric layer 222 to form metal gate stacks 220 respectively in the openings 154. The metal gate structures 220 cross over the active regions 114 of the N-type regions 110n. Each of the metal gate structures 220 includes the gate dielectric layer 222 and a metal gate electrode 224 over the gate dielectric layer 222. The metal gate electrode 224 may include metal layers 225, e.g., work function metal layer(s) and capping layer(s), a fill layer(s) 226, and/or other suitable layers that are desirable in a metal gate stack. The work function metal layer may include n-type work function metal. Exemplary n-type work function metals include Ti, Ag, TaAl, TaAlC, TiAlN, TaC, TaCN, TaSiN, Mn, Zr, other suitable n-type work function materials, or combinations thereof. The work function metal layer may have multiple layers. The work function metal layer(s) may be deposited by CVD, PVD, electroplating and/or other suitable process. In some embodiments, the capping layer in the metal gate electrodes may include refractory metals and their nitrides (e.g. TiN, TaN, $W_2N$, TiSiN, TaSiN). The capping layer may be deposited by PVD, CVD, metal-organic chemical vapor deposition (MOCVD) ALD, or the like. In some embodiments, the fill layer 226 in the metal gate electrodes may include tungsten (W). The fill layer 226 may be deposited by ALD, PVD, CVD, or other suitable process. In some embodiments, the metal gate electrode is an n-type metal gate including an n-type work function metal layer, such that the metal gate structures 220 may be referred to as N-type metal gate structures 220.

In FIGS. 10A and 10B, the semiconductor device may be (a part of) a driver circuit and includes the active regions 112 and 114, the P-type metal gate structures 210, and the dummy gate electrodes 142b. The P-type metal gate structures 210 are above the active regions 112 and form a P-type gate array. Each of the P-type metal gate structures 210 and the corresponding active region 112 (and the epitaxial structures 160) form a p-type functional (or active) transistor. The dummy gate electrodes 142b are inserted in the P-type array. That is, the dummy gate electrodes 142b are formed above the active regions 112 and among the P-type metal gate structures 210. Each of the dummy gate electrodes 142b and the corresponding active region 112 (and the epitaxial structures 160) form a dummy transistor, which are tied to ground or supply and not expected to function. The number of the dummy gate electrodes 142b is less than the number of the P-type metal gate structures 210. That is, the number of the dummy transistors is less than the number of the p-type functional transistors. The configuration of the P-type metal gate structures 210 is benefit for increasing the driving current of the driver circuit.

In FIG. 10B, each of the P-type metal gate structures 210 has a width W3 in the x-direction, and each of the dummy gate electrodes 142b has a width W4 in the x-direction, where the width W4 is substantially equal to the width W3. The neighboring P-type metal gate structures 210 has a gate pitch P1 in the x-direction, and the neighboring dummy gate electrode 142b and the P-type metal gate structure 210 has a gate pitch P2 in the x-direction and substantially the same as the gate pitch P1. Further, the neighboring dummy gate electrode 142b has a gate pitch substantially the same as the gate pitch P2 (or the gate pitch P1). Moreover, the dummy gate electrode 142b and the P-type metal gate structure 210 have substantially the same length in the y-direction. In some embodiments, the neighboring dummy gate electrode 142b and the P-type metal gate structure 210 are above a same active region 112.

The P-type metal gate structures 210 and the dummy gate electrodes 142b include different materials. For example, each of the P-type metal gate structures 210 includes metals, and each of the dummy gate electrodes 142b is free from metals. Hence, the dummy gate electrodes 142b are not easily removed during the planarization process. In some embodiments, each of the dummy gate electrodes 142b includes semiconductor materials such as polysilicon or other suitable materials. In some embodiments, the P-type metal gate structures 210 have an electrical conductivity higher than that of the dummy gate electrodes 142b.

In some embodiments, there are plural groups of dummy gate electrodes 142b inserted among the array of P-type metal gate structures 210. For example, in FIG. 10A, the semiconductor device includes first groups G1 of the dummy gate electrodes 142b, second groups G2 of the dummy gate electrodes 142b, third groups G3 of the dummy gate electrodes 142b, fourth groups G4 of the dummy gate electrodes 142b, and a fifth group G5 of the dummy gate electrodes 142b. The first to fifth groups G1-G5 of the dummy gate electrodes 142b are arranged in the x-direction.

The numbers of the dummy gate electrodes 142b in the first to fifth groups G1-G5 may be different. For example, the number of the dummy gate electrodes 142b in the first group G1 is less than or equal to the number of the dummy gate electrodes 142b in the second group G2, the number of the dummy gate electrodes 142b in the second group G2 is less than or equal to the number of the dummy gate electrodes 142b in the third group G3, the number of the dummy gate electrodes 142b in the third group G3 is less than or equal to the number of the dummy gate electrodes 142b in the fourth group G4, and/or the number of the dummy gate electrodes 142b in the fourth group G4 is less than or equal to the number of the dummy gate electrodes 142b in the fifth group G5. In some embodiments, the first group G1 includes single one dummy gate electrode 142b in the x-direction, the second group G2 includes two of the dummy gate electrodes 142b in the x-direction, the third group G3 includes three of the dummy gate electrodes 142b in the x-direction, the fourth group G4 includes fourth of the dummy gate electrodes 142b in the x-direction, and/or the fifth group G5 includes five of the dummy gate electrodes 142b in the x-direction. In some embodiments, the first to fifth groups G1-G5 have the same number (e.g., 16 in FIG. 10A) of the dummy gate electrodes 142b in the y-direction. It is noted that the numbers of the dummy gate electrodes 142b in each of the first to fifth groups G1-G5 are illustrative, and should not limit the scopes of the present disclosure.

In some embodiments, the first groups G1 are respectively disposed above edges of the P-type region 110p, and the fifth group G5 is disposed above the center of the P-type region 110p. One of the second groups G2 is disposed between one of the first groups G1 and one of the third groups G3, one of the third groups G3 is disposed between one of the second groups G2 and one of the fourth groups G4, one of the fourth groups G4 is disposed between the fifth group G5 and one of the third groups G3, and/or the fifth group G5 is disposed between the fourth groups G4.

The semiconductor device further includes the N-type metal gate structures 220. The N-type metal gate structures 220 are disposed above the N-type region 110n and form another array. In some embodiments, the array of the N-type metal gate structures 220 surrounds the array of the P-type metal gate structures 210. Each of the N-type metal gate structures 220 and the corresponding active region 114 form an n-type functional (or an active) transistor. Each of the N-type metal gate structures 220 has a width W5 in the x-direction and substantially equal to the width W3 of each of the P-type metal gate structures 210. Further, the neighboring N-type metal gate structures 220 has a gate pitch P3 in the x-direction and substantially the same as the gate pitch P1 of the neighboring P-type metal gate structures 210. In some other embodiments, however, the gate pitch P3 of the N-type metal gate structures 220 is different from the gate pitch P1 of the P-type metal gate structures 210. Moreover, the dummy gate electrode 142b, the P-type metal gate structure 210, and the N-type metal gate structures 220 have substantially the same length in the y-direction. The N-type metal gate structures 220 include metals, and the work function metal layer(s) of the N-type metal gate structures 220 is different from the work function metal layer(s) of the P-type metal gate structures 210.

As mentioned above, the dummy gate electrodes improve the dishing/erosion issues occurring during the planarization process. Without the dishing/erosion problem, metal residue would not remain above the P-type metal gate structure during the formation of the N-type metal gate structure. Further, there is no additional mask layer used in these embodiments, and the remaining of the dummy gate electrodes does not complicate the manufacturing process for forming the semiconductor device.

Figure 11:
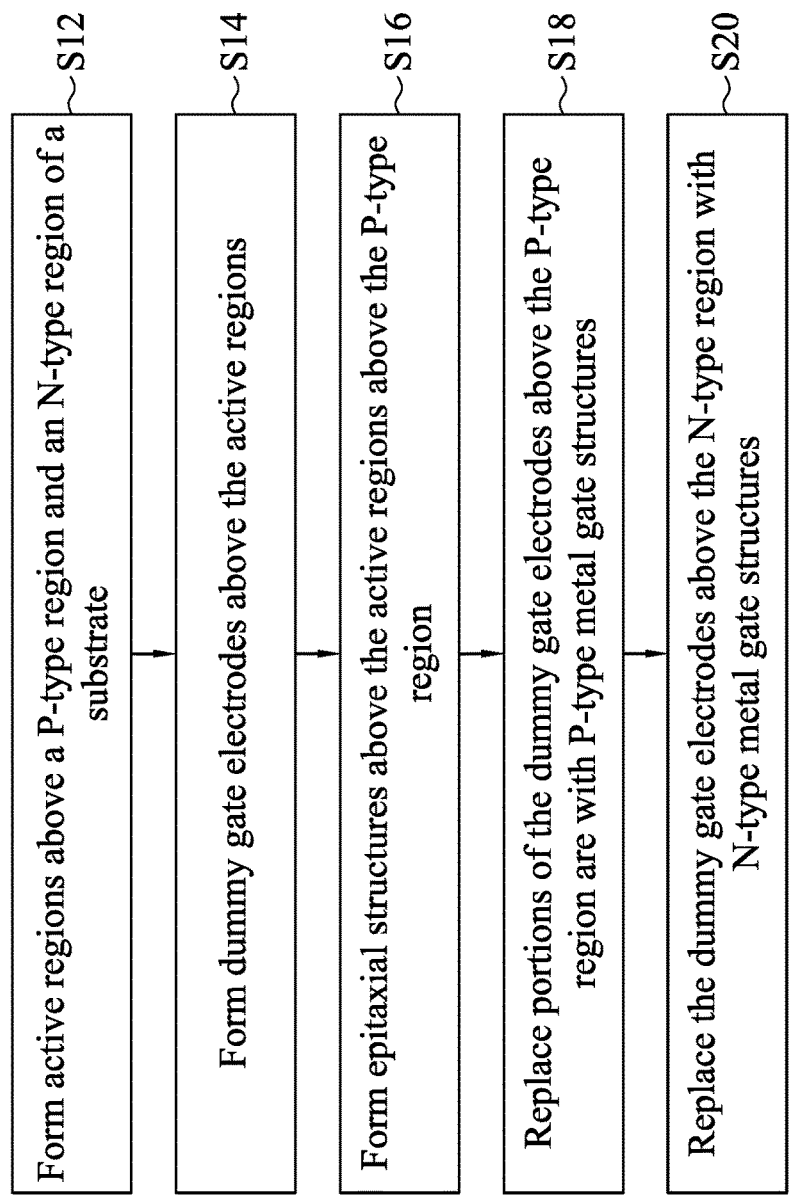
FIG. 11 is a flow chart of a method for forming a semiconductor device in accordance with some embodiments of the present disclosure.

FIG. 11 is a flow chart of a method M for forming a semiconductor device in accordance with some embodiments of the present disclosure. Although the method M is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S12, active regions are formed above a P-type region and an N-type region of a substrate. FIGS. 1 and 2 illustrate top views of some embodiments corresponding to act in block S12. At block S14, dummy gate electrodes are formed above the active regions. FIGS. 3A and 3B illustrate a top view and a cross-sectional view of some embodiments corresponding to act in block S14. At block S16, epitaxial structures are formed above the active regions above the P-type region. FIGS. 5A and 5B illustrate a top view and a cross-sectional view of some embodiments corresponding to act in block S16. At block S18, portions of the dummy gate electrodes above the P-type region are replaced with P-type metal gate structures. FIGS. 7A-8B illustrate top views and cross-sectional views of some embodiments corresponding to act in block S18. At block S20, the dummy gate electrodes above the N-type region are replaced with N-type metal gate structures. FIGS. 9A-10B illustrate top views and cross-sectional views of some embodiments corresponding to act in block S20.

Figure 12A:
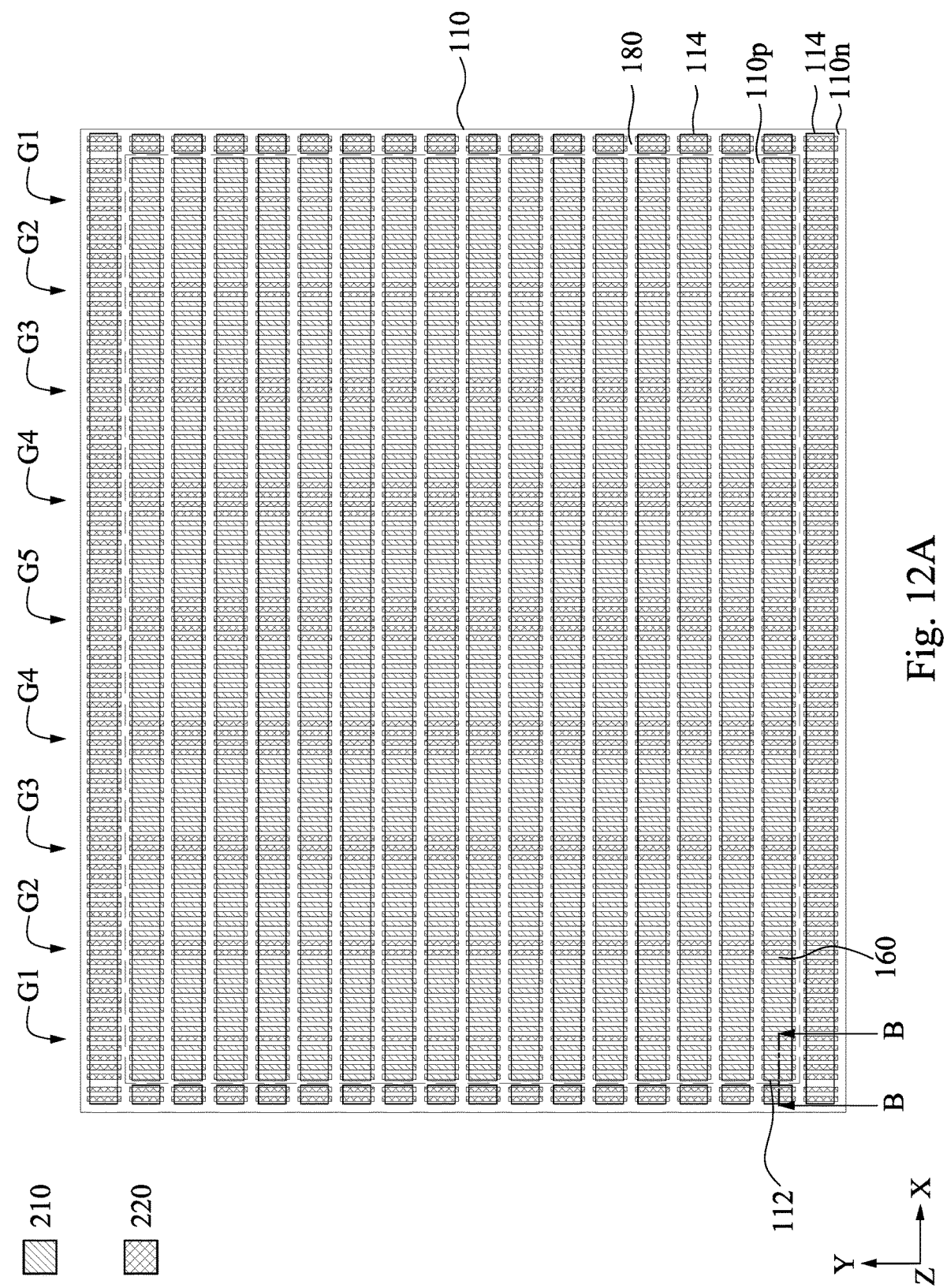
FIG. 12A is a top view of a semiconductor device according to some embodiments of the present disclosure.
Figure 12B:
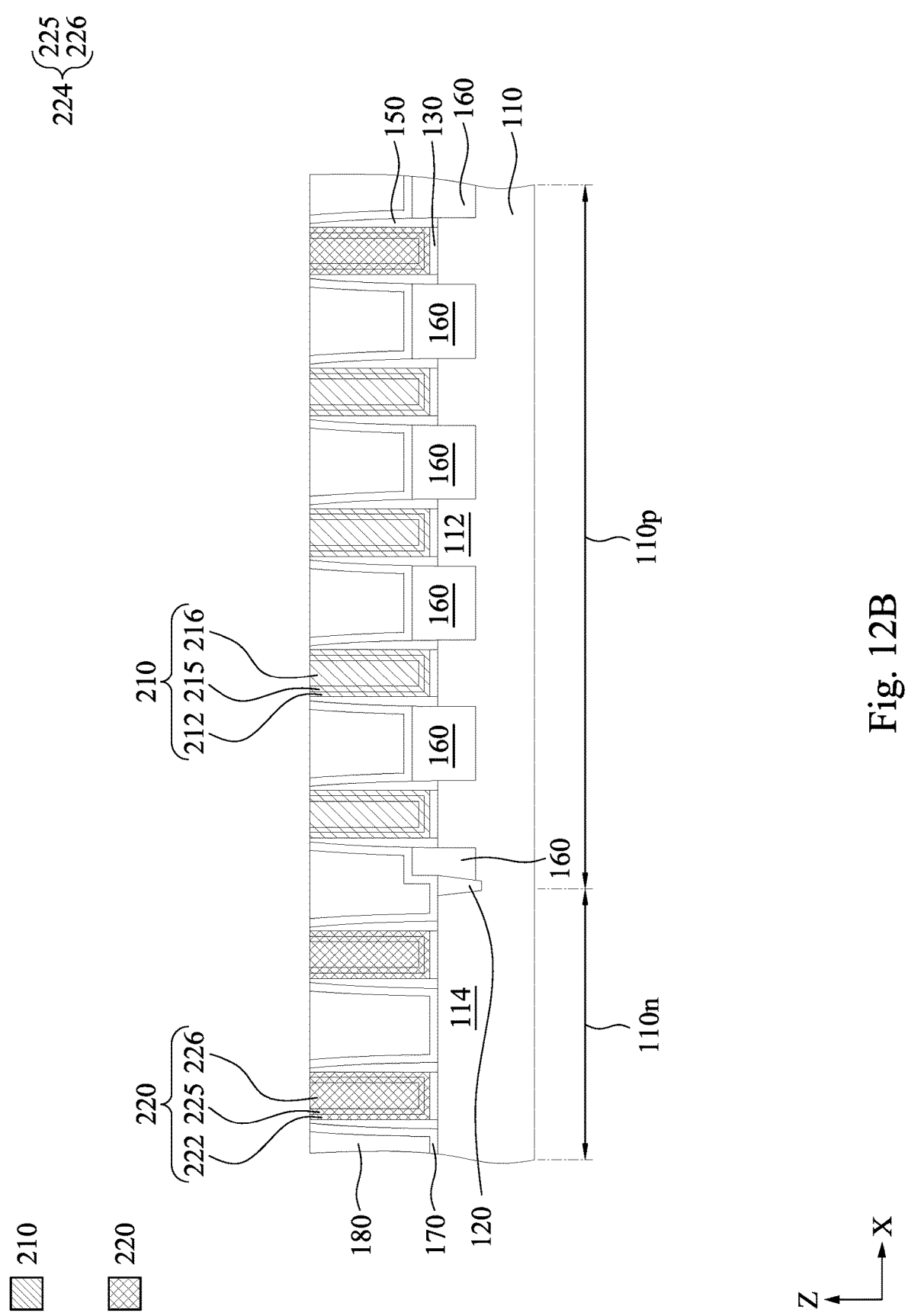
FIG. 12B is a cross-sectional view taken along line B-B in FIG. 12A.

FIG. 12A is a top view of a semiconductor device according to some embodiments of the present disclosure, and FIG. 12B is a cross-sectional view taken along line B-B in FIG. 12A. The difference between the semiconductor devices in FIGS. 12A and 12B and FIGS. 10A and 10B pertains to the presence of the dummy gate electrodes 142b. In FIGS. 12A and 12B, after the first RPG process of the P-type metal gate structures 210, another patterned mask layer is formed above the structure in FIGS. 8A and 8B, where the patterned mask layer exposes not only the dummy gate electrodes 142c (see FIGS. 8A and 8B) but also the dummy gate electrodes 142b. The dummy gate electrodes 142b and 142c are then removed, and the N-type metal gate structures 220 are formed. As such, portions of the N-type metal gate structures 220 are formed above the P-type region 110p and inserted between the P-type metal gate structures 210, such as the groups G1-G5 of the N-type metal gate structures 220 shown in FIG. 12A. In some embodiments, the N-type metal gate structures 220 above the P-type region 110p are used to form dummy devices (dummy transistors), which are tied to ground or supply and not expected to function. In contrast, the N-type metal gate structures 220 above the N-type region 110n are N-type functional (or active) transistors. The arrangements and locations of the portions of the N-type metal gate structures 220 above the P-type region 110p may be similar or the same as the dummy gate electrodes 140b in FIGS. 10A and 10B, and, therefore, a description in this regard will not be repeated hereinafter.

FIGS. 13A-15B illustrate a method for manufacturing a semiconductor device at various stages in accordance with some embodiments of the present disclosure. Throughout the various views and illustrative embodiments, like reference numbers are used to designate like elements. The present embodiment may repeat reference numerals and/or letters used in FIGS. 1-10B. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 13A-15B.

Figure 13A:
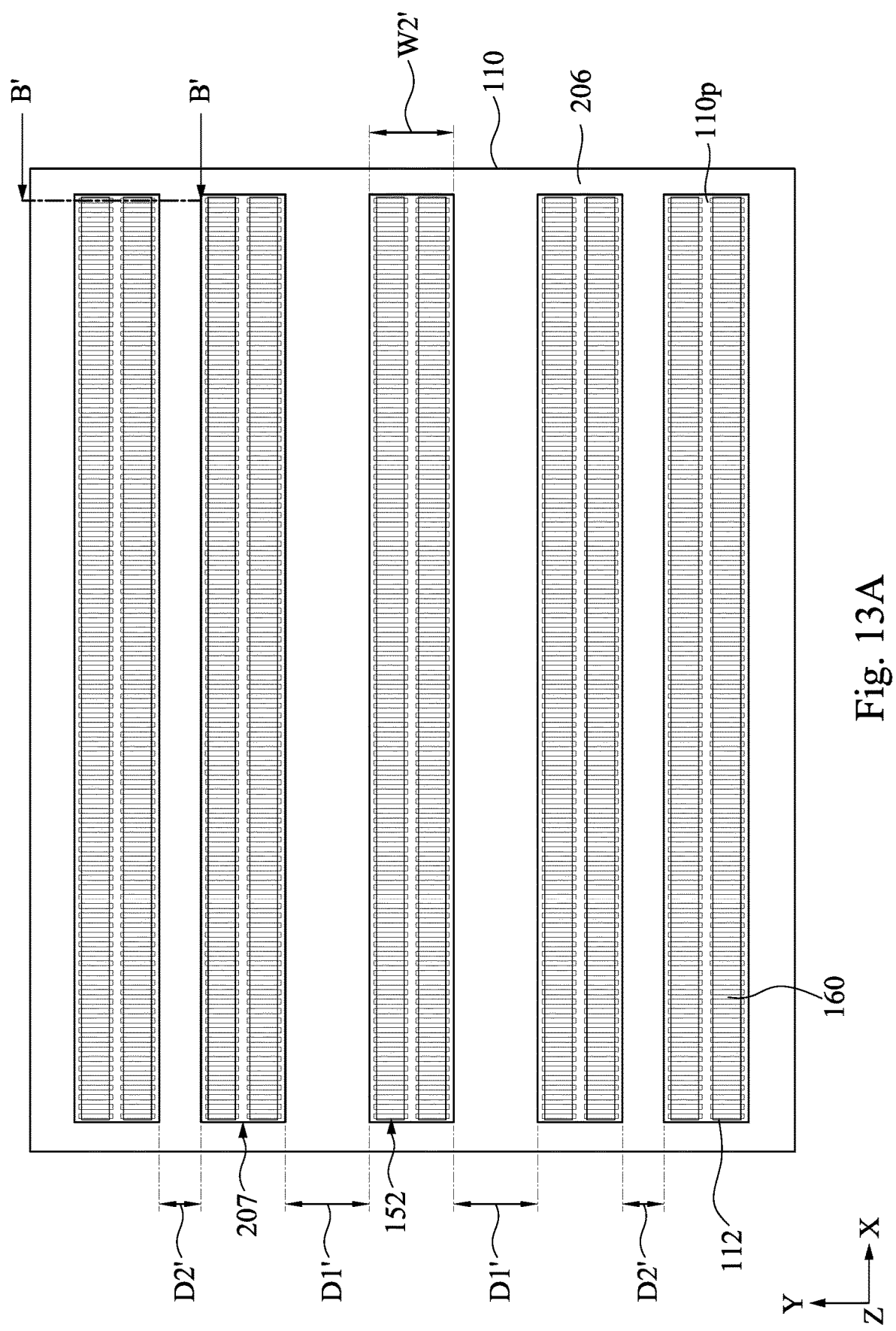
FIGS. 13A-15B illustrate a method for manufacturing a semiconductor device at various stages in accordance with some embodiments of the present disclosure.
Figure 13B:
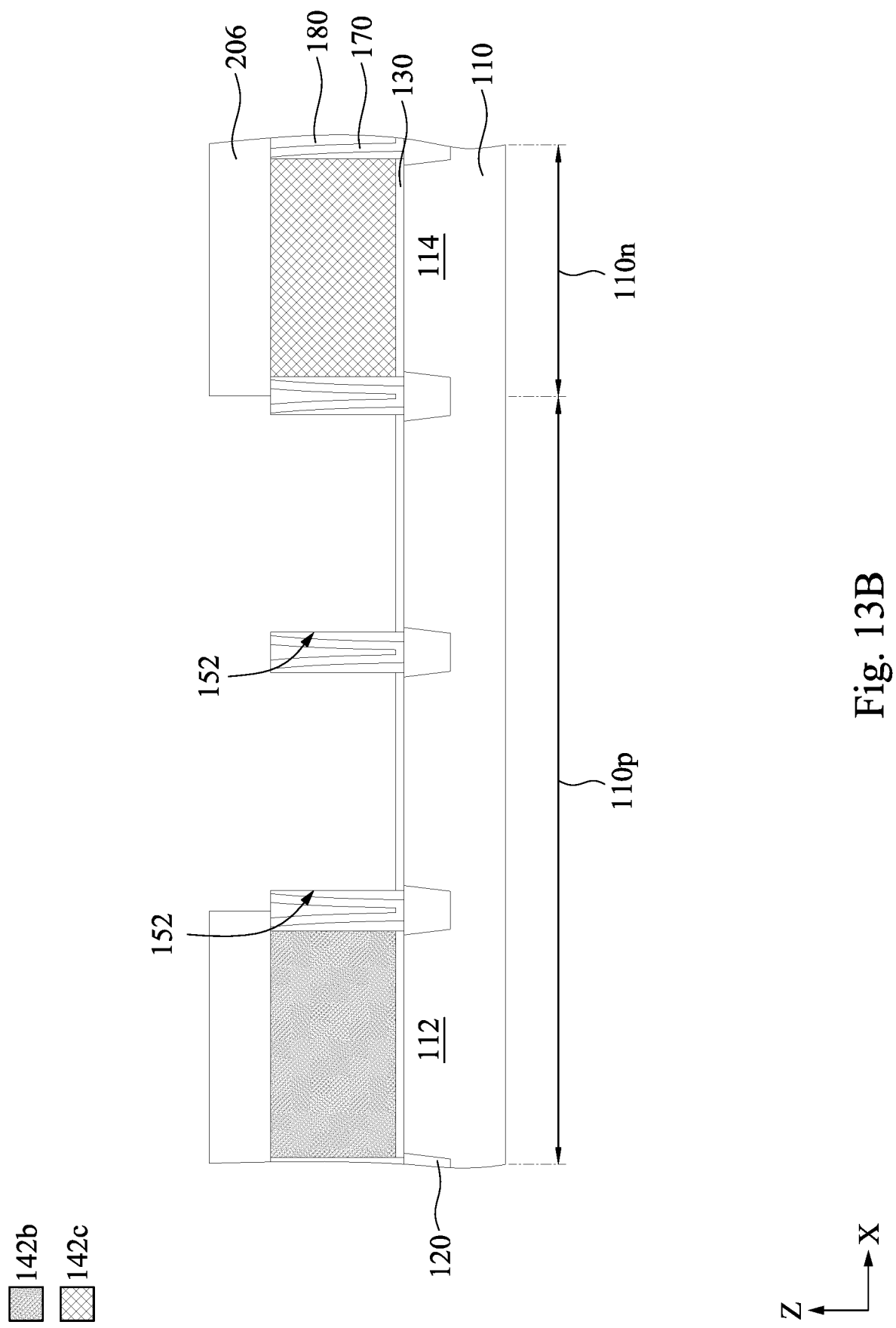

The processes in FIGS. 1-6B are performed in advance. Reference is then made to FIGS. 13A and 13B, where FIG. 13B is a cross-sectional view taken along line B'-B' in FIG. 13A. A first RPG process scheme for P-type devices is employed. Specifically, a mask layer is formed over the structure of FIG. 6A, and the mask layer is patterned to form a patterned mask layer 206. The patterned mask layer 206 exposes the dummy gate electrodes 142a but covers the dummy gate electrodes 142b and 142c. That is, the first RPG process replaces the dummy gate electrodes 142a with metal gate structures.

Subsequently, the dummy gate electrodes 142a are removed to respectively form openings 152 with the spacer structures 150 as their sidewalls. The dummy gate electrodes 142a may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 14A:
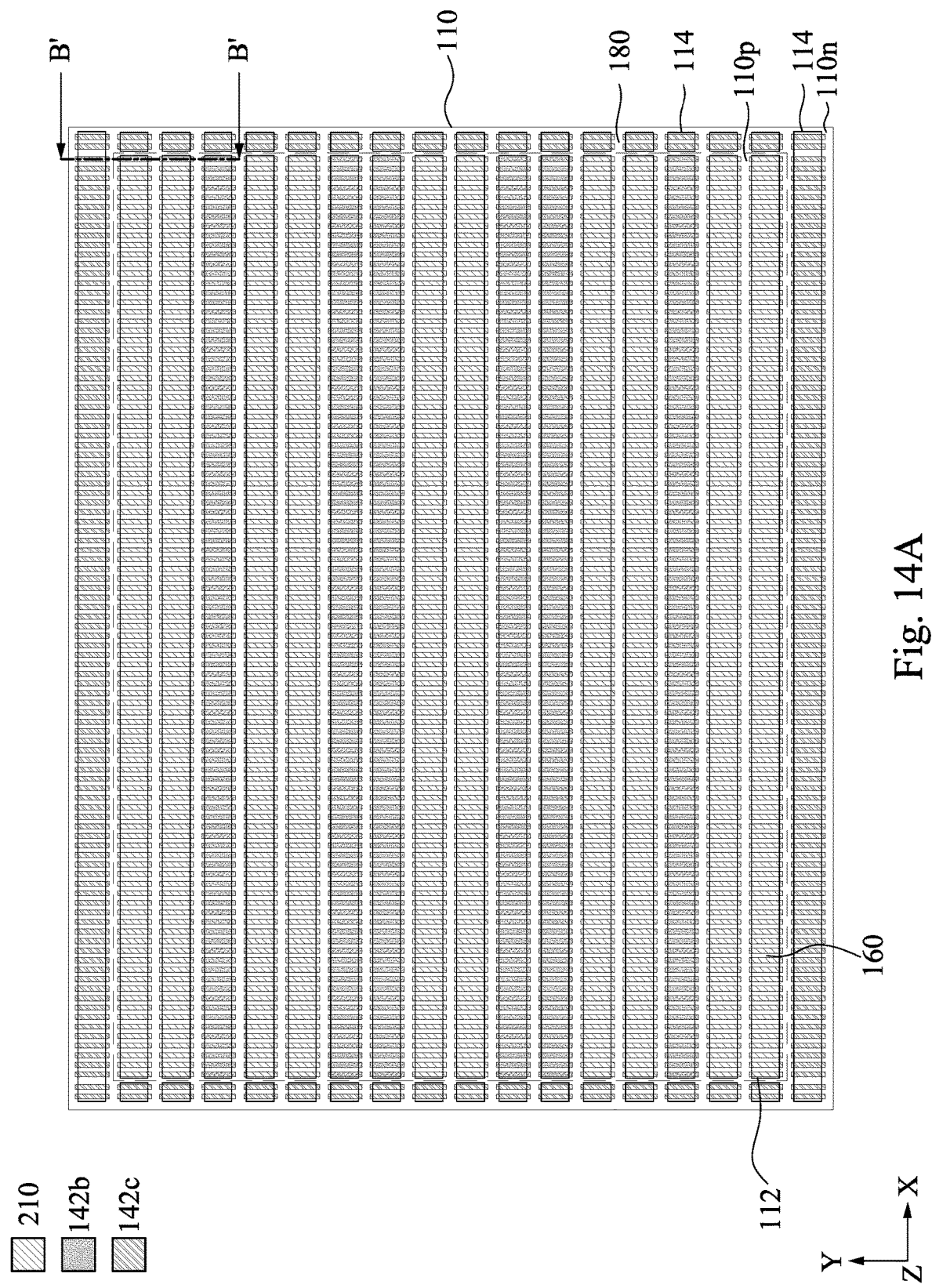
Figure 14B:
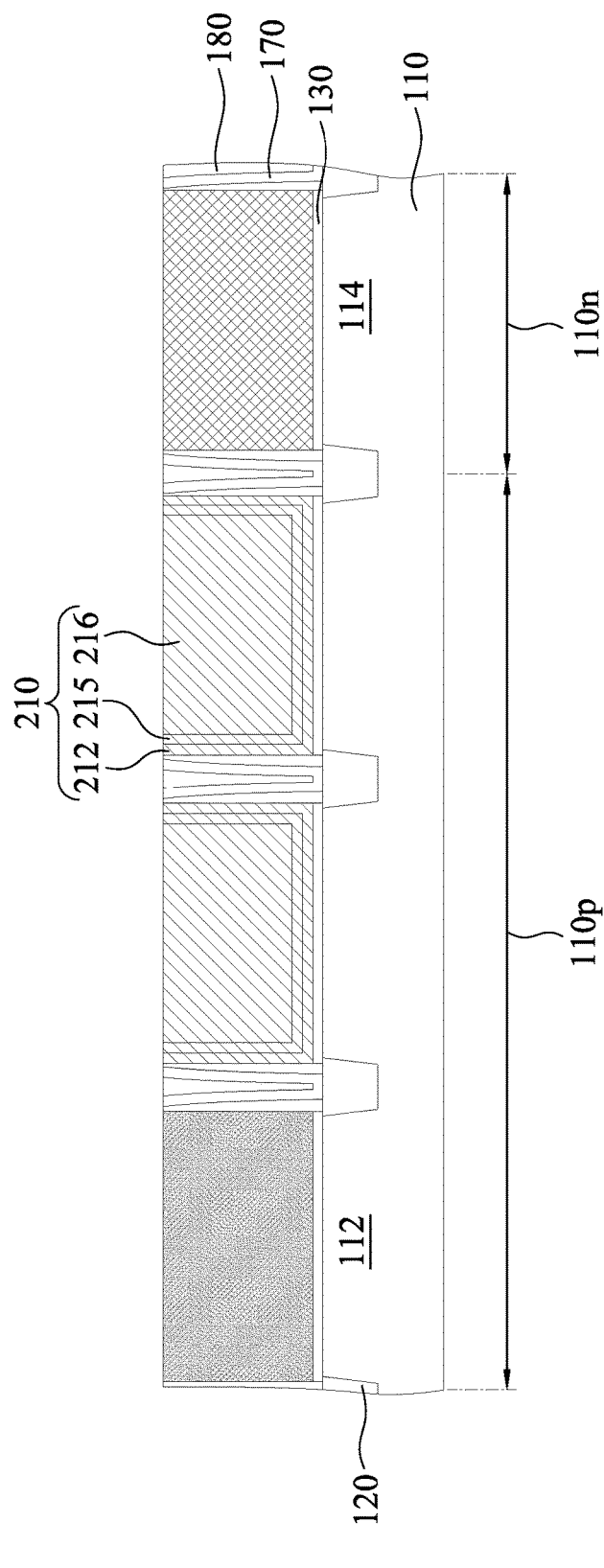

Reference is made to FIGS. 14A and 14B. The patterned mask layer 206 in FIGS. 13A and 13B is then removed, and the removal method may be performed by etching, solvent stripping, and/or plasma ashing, for example. A gate dielectric layer 212 is then formed in the openings 152, and at least one metal layer is formed in the openings 152 and on the gate dielectric layer 212. Subsequently, a chemical mechanical planarization (CMP) process is performed to planarize the metal layer and the gate dielectric layer 212 to form metal gate stacks 210 respectively in the openings 152. The metal gate structures 210 cross over the active regions 112 of the P-type regions 110p. Each of the metal gate structures 210 includes the gate dielectric layer 212 and a metal gate electrode 214 over the gate dielectric layer 212. The metal gate electrode 214 may include metal layers 215, e.g., work function metal layer(s) and capping layer(s), a fill layer(s) 216, and/or other suitable layers that are desirable in a metal gate stack.

The difference between the embodiments of FIGS. 13A-14B and FIGS. 7A-8B pertains to the patterned mask layers 206 and 202 (see FIGS. 7A and 7B). In FIGS. 13A and 13B, the patterned mask layer 206 has a plurality of openings 207. In some embodiments, each of the openings 207 has a width W2' in a range of about 5 um to about 30 um. The distance between neighboring openings 207 may be different. For example, the distance at the center of the P-type region 110p is greater than the distance at the edge of the P-type region 110p. For example, the distance D1' is greater than the distance D2'. Each of the distances D1'-D2' is in a range of about 0.16 um to about 5 um. If the distance D1' (or D2') is less than about 0.16 um, the metal loss issue still remains; if the distance D1' (or D2' is greater than about 5 um, the electrically efficiency of the semiconductor device is reduced (since there are too many dummy gate electrodes 142b among the P-type metal gate structures 210).

Figure 15A:
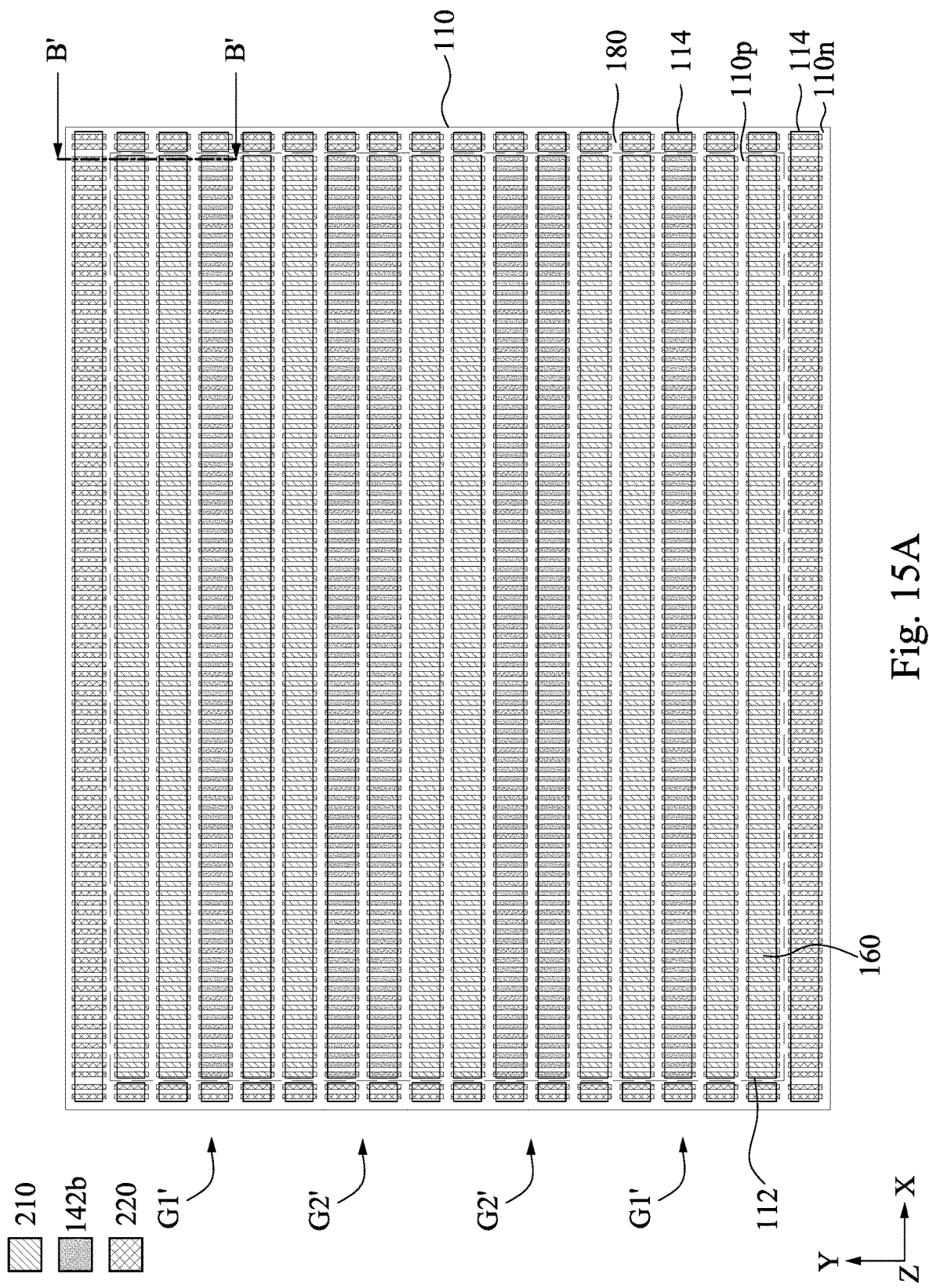
Figure 15B:
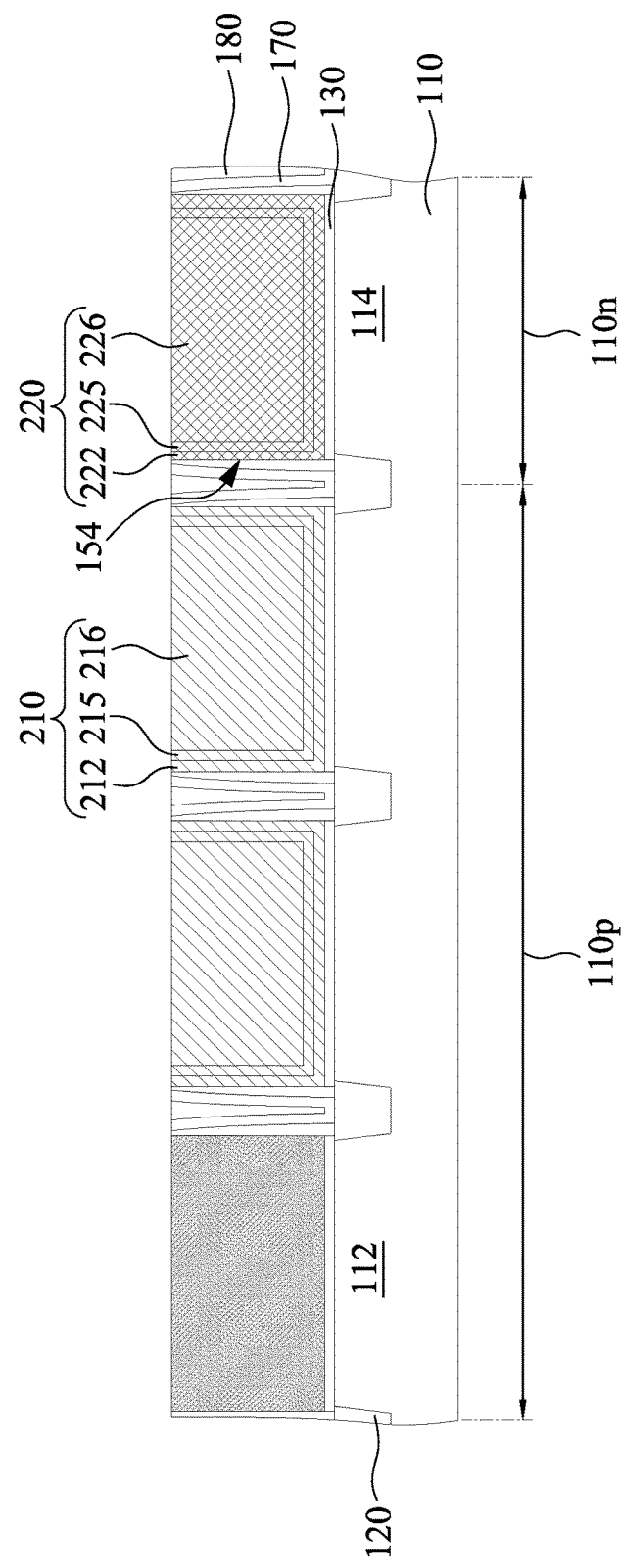

Reference is made to FIGS. 15A and 15B. A second RPG process scheme for N-type devices is employed. Specifically, another mask layer is formed over structure of FIGS. 14A and 14B, and the mask layer is patterned to form a patterned mask layer (not shown but similar to the patterned mask layer in FIGS. 9A and 9B). The patterned mask layer exposes the dummy gate electrodes 142c but covers the dummy gate electrodes 142b and the P-type metal gate structures 210. That is, the second RPG process replaces the dummy gate electrodes 142c with metal gate structures. Subsequently, the dummy gate electrodes 142c are removed to respectively form openings 154 with the spacer structures 150 as their sidewalls.

The patterned mask layer is then removed, and N-type metal gate stacks 220 are respectively in the openings 154. The structural and manufacturing details of the N-type metal gate stacks 220 are described above, and, therefore, a description in this regard will not be repeated hereinafter.

The semiconductor devices in FIGS. 15A and 15B and FIGS. 10A and 10B pertains to the arrangement of the P-type metal gate structures 210 and the dummy gate electrodes 140b. In FIGS. 15A and 15B, there are plural groups of dummy gate electrodes 142b inserted among the array of P-type metal gate structures 210. For example, in FIG. 15A, the semiconductor device includes first groups G1' of the dummy gate electrodes 142b and second groups G2 of the dummy gate electrodes 142b. The first and second groups G1'-G2' of the dummy gate electrodes 142b are arranged in the y-direction.

The numbers of the dummy gate electrodes 142b in the first and second groups G1'-G2' may be different. For example, the number of the dummy gate electrodes 142b in the first group G1' is less than or equal to the number of the dummy gate electrodes 142b in the second group G2'. In some embodiments, the first group G1' includes single one dummy gate electrode 142b in the y-direction, and the second group G2' includes two of the dummy gate electrodes 142b in the y-direction. In some embodiments, the first and second groups G1'-G2' have the same number (e.g., 97 in FIG. 15A) of the dummy gate electrodes 142b in the x-direction. It is noted that the numbers of the dummy gate electrodes 142b in each of the first and second groups G1'-G2' are illustrative, and should not limit the scopes of the present disclosure. In some embodiments, the first groups G1' are respectively disposed above edges of the P-type region 110p, and the second group G2' is disposed above the center of the P-type region 110p. Other relevant structural details of the semiconductor device in FIGS. 15A and 15B are the same as or similar to the semiconductor device in FIGS. 10A and 10B, and, therefore, a description in this regard will not be repeated hereinafter.

Figure 16A:
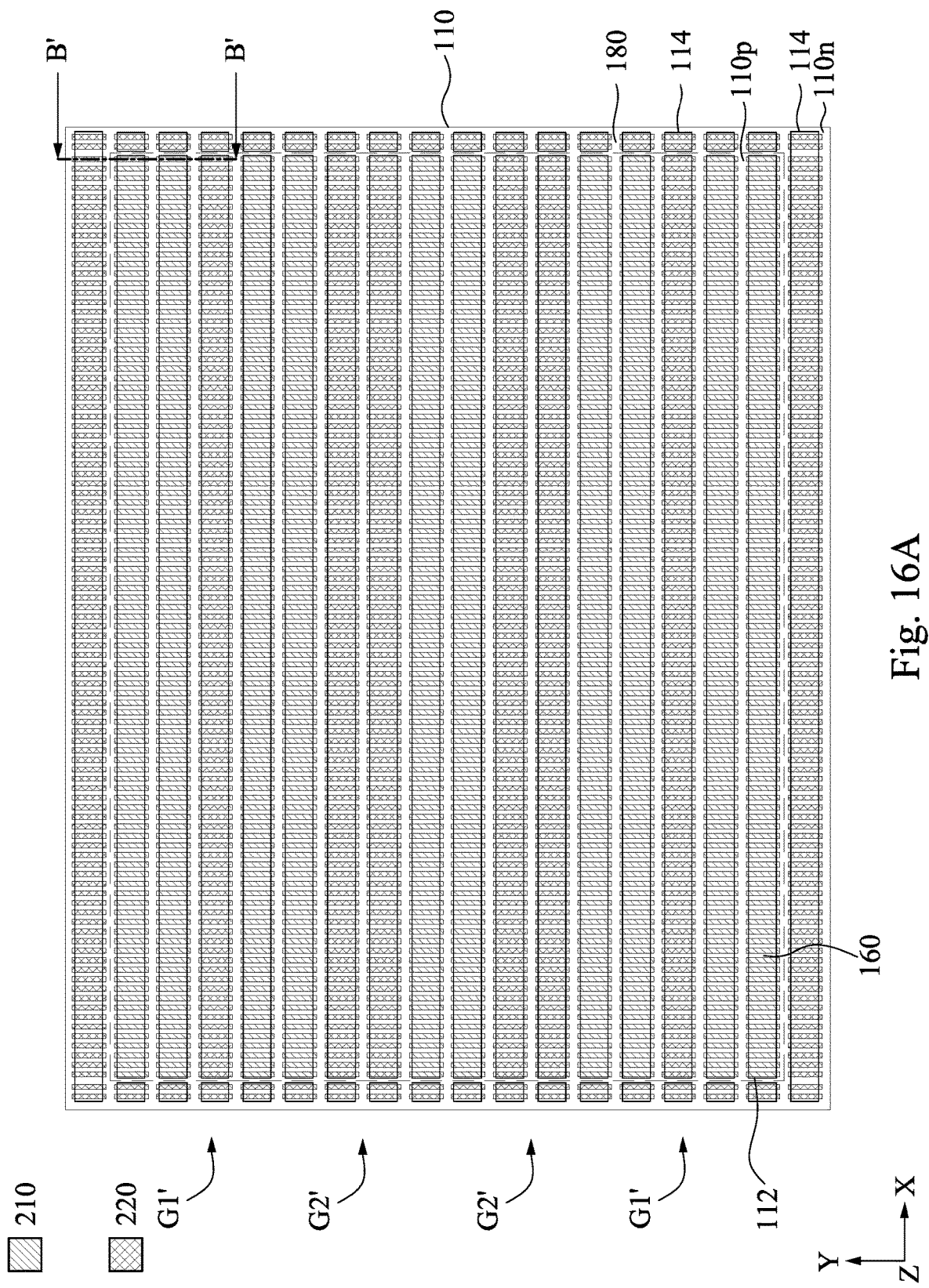
FIG. 16A is a top view of a semiconductor device according to some embodiments of the present disclosure.
Figure 16B:
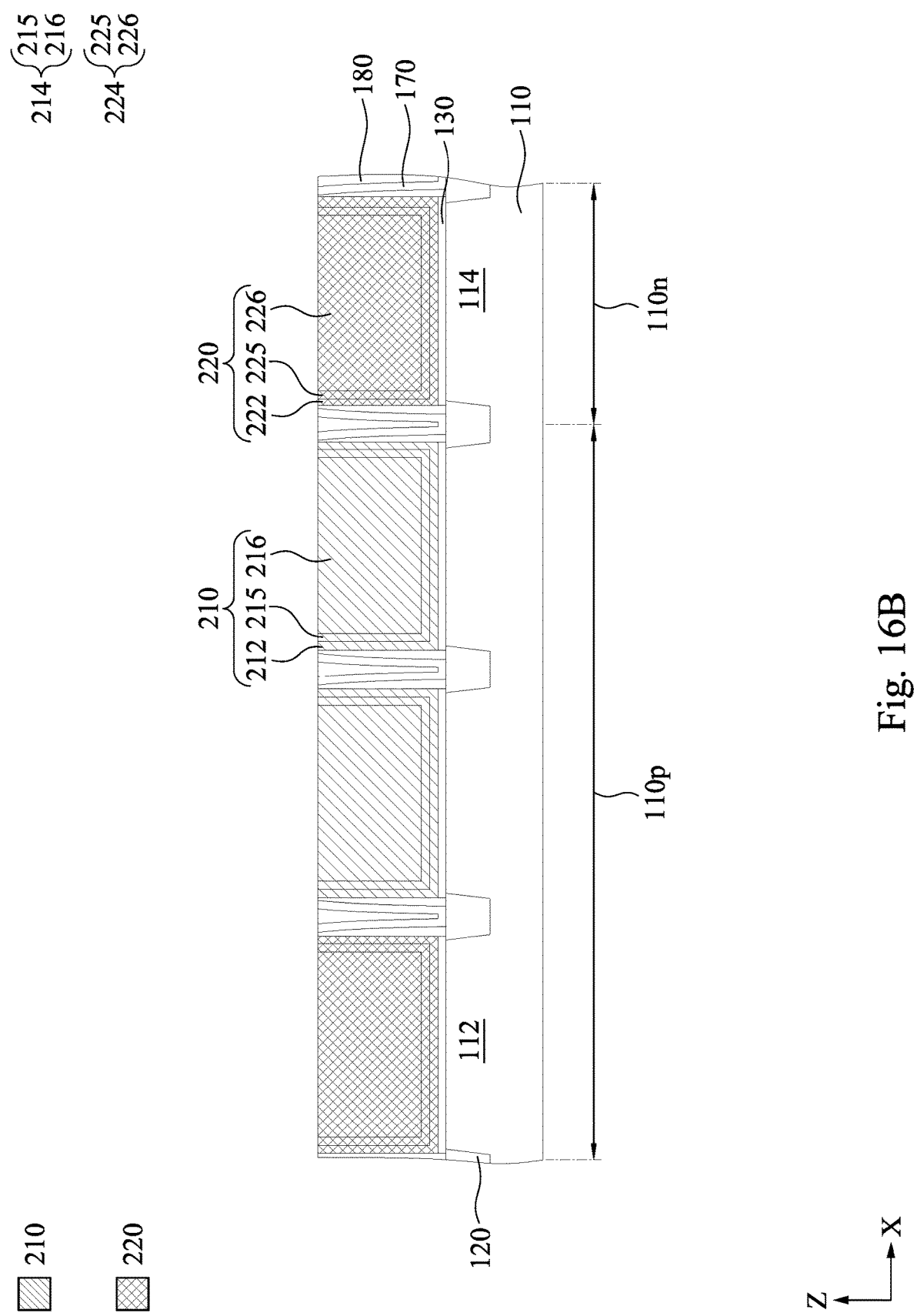
FIG. 16B is a cross-sectional view taken along line B'-B' in FIG. 16A.

FIG. 16A is a top view of a semiconductor device according to some embodiments of the present disclosure, and FIG. 16B is a cross-sectional view taken along line B'-B' in FIG. 16A. The difference between the semiconductor devices in FIGS. 16A and 16B and FIGS. 15A and 15B pertains to the presence of the dummy gate electrodes 142b. In FIGS. 16A and 16B, after the first RPG process of the P-type metal gate structures 210, another patterned mask layer is formed above the structure in FIGS. 14A and 14B, where the patterned mask layer exposes not only the dummy gate electrodes 142c (see FIGS. 14A and 14B) but also the dummy gate electrodes 142b. The dummy gate electrodes 142b and 142c are then removed, and the N-type metal gate structures 220 are formed. As such, portions of the N-type metal gate structures 220 are formed above the P-type region 110p and inserted between the P-type metal gate structures 210. The arrangements and locations of the portions of the N-type metal gate structures 220 above the P-type region 110p may be similar or the same as the dummy gate electrodes 140b in FIGS. 15A and 15B, and, therefore, a description in this regard will not be repeated hereinafter.

Figure 17:
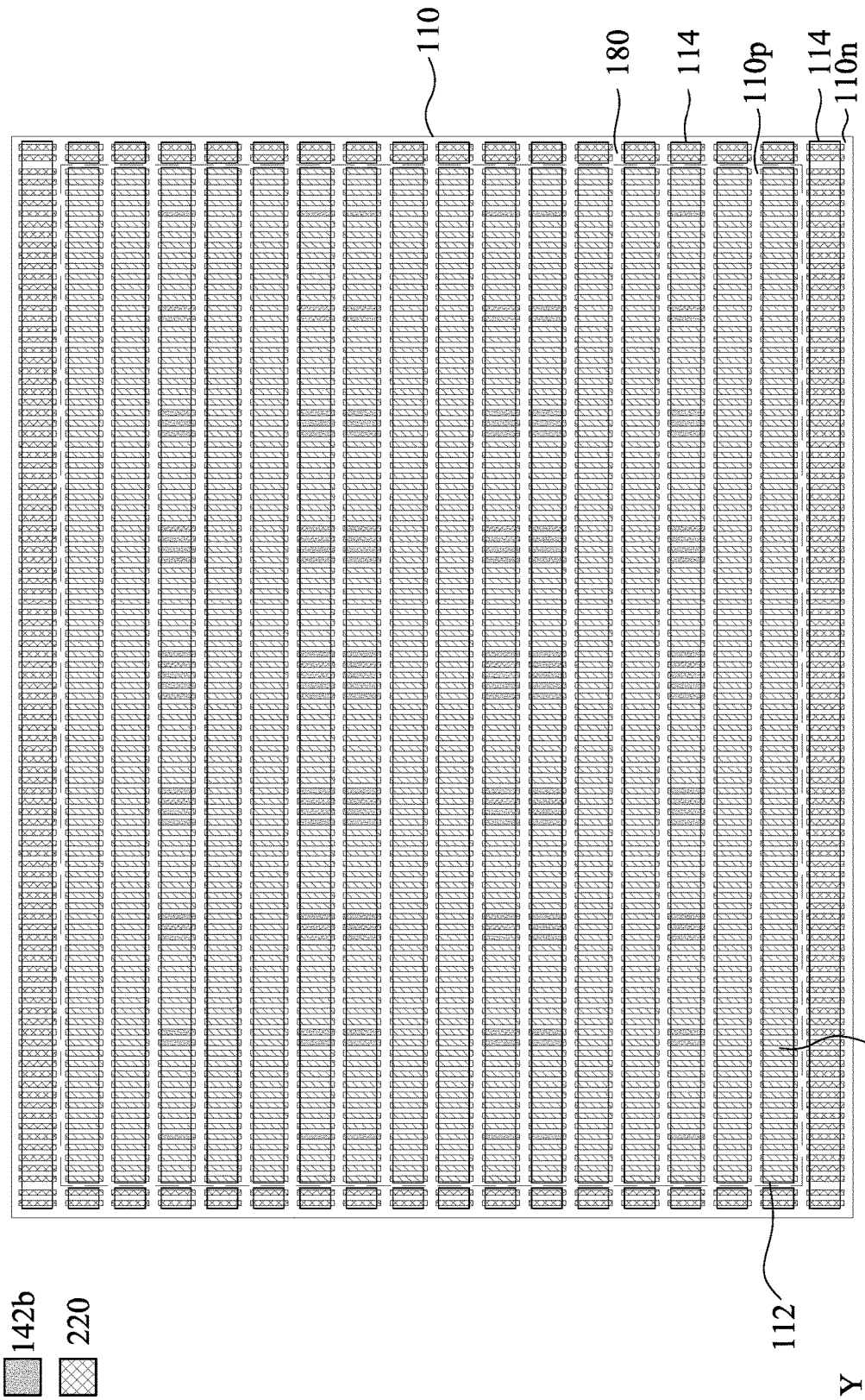
FIG. 17 is a top view of a semiconductor device according to some embodiments of the present disclosure.

FIG. 17 is a top view of a semiconductor device according to some embodiments of the present disclosure. The difference between the semiconductor devices in FIG. 17 and FIGS. 10A and 15A pertains to the arrangements of the dummy gate electrodes 142*b*. In FIG. 17, there are plural groups of the dummy gate electrodes 142*b*. The numbers of the dummy gate electrodes 142*b* in each group vary not only in the x-direction but also in the y-direction. For example, the groups of the dummy gate electrodes 142*b* at corners of the P-type region 110*p* each includes single one of the dummy gate electrodes 142*b*, and the groups of the dummy gate electrodes 142*b* at the center of the P-type region 110*p* each includes ten of the dummy gate electrodes 142*b*. Other structural and/or manufacturing details of the semiconductor device in FIG. 17 may be similar or the same as the semiconductor device in FIGS. 10A and 15A, and, therefore, a description in this regard will not be repeated hereinafter.

Figure 18:
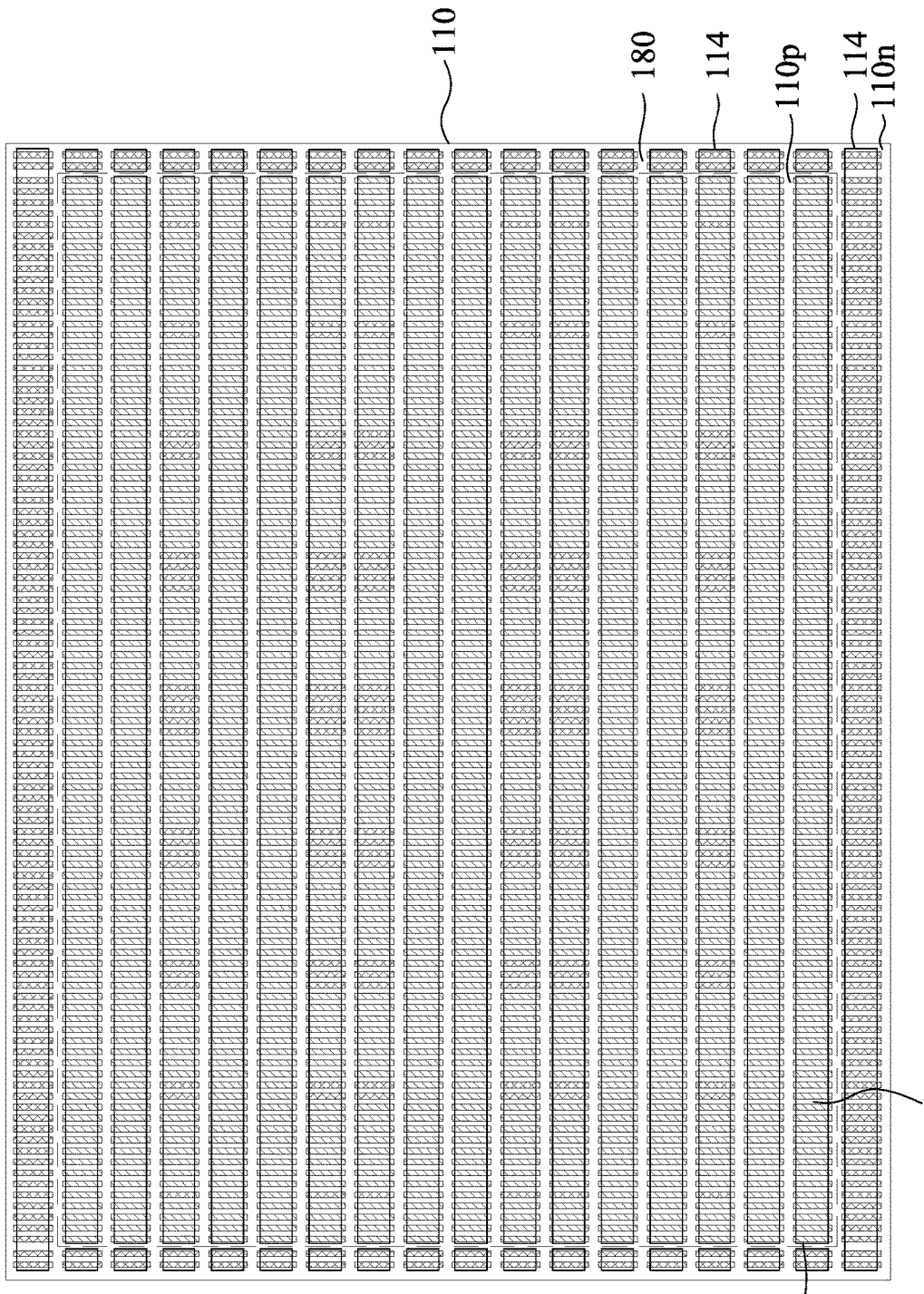
FIG. 18 is a top view of a semiconductor device according to some embodiments of the present disclosure.

FIG. 18 is a top view of a semiconductor device according to some embodiments of the present disclosure. The difference between the semiconductor devices in FIG. 18 and FIG. 17 pertains to the presence of the dummy gate electrodes 142*b*. In FIG. 18, after the first RPG process of the P-type metal gate structures 210, another patterned mask layer is formed above the structure, where the patterned mask layer exposes not only the dummy gate electrodes 142*c* but also the dummy gate electrodes 142*b*. The dummy gate electrodes 142*b* and 142*c* are then removed, and the N-type metal gate structures 220 are formed. As such, portions of the N-type metal gate structures 220 are formed above the P-type region 110*p* and inserted between the P-type metal gate structures 210. The arrangements and locations of the portions of the N-type metal gate structures 220 above the P-type region 110*p* may be similar or the same as the dummy gate electrodes 140*b* in FIG. 17, and, therefore, a description in this regard will not be repeated hereinafter.

Based on the above discussions, it can be seen that the present disclosure offers advantages. It is understood, however, that other embodiments may offer additional advantages, and not all advantages are necessarily disclosed herein, and that no particular advantages are required for all embodiments. One advantage is that the dummy gate electrodes improve the dishing/erosion issues occurring during the planarization process. Without the dishing/erosion problem, metal residue would not remain above the P-type metal gate structure during the formation of the N-type metal gate structure. Another advantage is that there is no additional mask layer used in these embodiments, and the remaining of the dummy gate electrodes does not complicate the manufacturing process for forming the semiconductor device.

According to some embodiments, a semiconductor device includes active gate structures and dummy gate electrodes. The active gate structures are above an active region of a substrate. The dummy gate electrodes are above the active region of the substrate. A number of the dummy gate electrodes is less than a number of the active gate structures. The active gate structures and the dummy gate electrodes have different materials, and a distance between adjacent one of the dummy gate electrodes and one of the active gate structures is substantially the same as a gate pitch of the active gate structures.

According to some embodiments, a semiconductor device includes a substrate, P-type active gate structures, a first group and a second group of dummy gate electrodes, and N-type active gate structures. The substrate has a P-type region and an N-type region adjacent the P-type region. The P-type active gate structures are above the P-type region. The first group and second group of dummy gate electrodes are separated from each other and are inserted among the P-type active gate structures. Each of the dummy gate electrodes has a width substantially the same as a width of each of the P-type active gate structures. The N-type active gate structures are above the N-type region.

According to some embodiments, a method for manufacturing a semiconductor device includes forming a first active region above a first type region of a substrate and a second active region above a second type region of the substrate. First dummy gate electrodes and second dummy gate electrodes are formed above the first active region. A number of the first dummy gate electrodes is greater than a number of the second dummy gate electrodes. Third dummy gate electrodes are formed above the second active region. The first dummy gate electrodes are replaced with first type gate electrodes while leaving the second dummy gate electrodes above the first active region. The third dummy gate electrodes are replaced with second type gate electrodes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device comprising:
    forming an isolation structure in a substrate to define a first continuous active region in a first type region of the substrate and a second active region in a second type region of the substrate;
    forming first dummy gate electrodes and second dummy gate electrodes above the first continuous active region, wherein a number of the first dummy gate electrodes is greater than a number of the second dummy gate electrodes, and the first continuous active region extends from beneath one of the first dummy gate electrodes to beneath one of the second dummy gate electrodes;
    forming third dummy gate electrodes above the second active region;
    replacing the first dummy gate electrodes with first type gate electrodes while leaving the second dummy gate electrodes above the first continuous active region; and
    replacing the third dummy gate electrodes with second type gate electrodes.

2. The method of claim 1, wherein replacing the first dummy gate electrodes with the first type gate electrodes comprises:
    forming a first mask layer to cover the second and third dummy gate electrodes and expose the first dummy gate electrodes;
    removing the first dummy gate electrodes to form first openings above the first type region; and
    forming the first type gate electrodes in the first openings.

3. The method of claim 2, wherein replacing the third dummy gate electrodes with the second type gate electrodes comprises:

forming a second mask layer to cover the first type gate electrodes and the second dummy gate electrodes and expose the third dummy gate electrodes;

removing the third dummy gate electrodes to form second openings above the second type region; and forming the second type gate electrodes in the second openings.

4. The method of claim 1, wherein a width of the first type gate electrodes is substantially the same as a width of the second dummy gate electrodes.

5. The method of claim 1, wherein the first type gate electrodes are between the second dummy gate electrodes and the second type gate electrodes.

6. The method of claim 1, wherein the first type region of the substrate extends in a first direction, and a length of the first type region of the substrate in the first direction is in a range of about 50 um to about 1500 um.

7. The method of claim 1, wherein the second dummy gate electrodes comprise a first group and a second group, the second type gate electrodes are closer to the first group of the second dummy gate electrodes than the second type gate electrodes are to the second group of the second dummy gate electrodes, and a number of the second dummy gate electrodes in the second group is greater than a number of the second dummy gate electrodes in the first group.

8. A method for manufacturing a semiconductor device comprising:

forming a first active region in a first type region of a substrate and a second active region in a second type region of the substrate;

forming first dummy gate electrodes and second dummy gate electrodes over the first active region of the substrate and third dummy gate electrodes over the second active region of the substrate simultaneously;

forming first spacer structures respectively surrounding the first dummy gate electrodes;

forming second spacer structures respectively surrounding the second dummy gate electrodes;

depositing a source/drain epitaxial structure in the first active region of the substrate and in contact with one of the first spacer structures and one of the second spacer structures;

forming a first mask over the substrate such that the first mask covers the second and third dummy gate electrodes and exposes the first dummy gate electrodes;

removing the first dummy gate electrodes to form first openings over the substrate;

removing the first mask;

after removing the first mask, forming first type gate electrodes in the first openings;

forming a second mask over the substrate such that the second mask covers the second dummy gate electrodes and the first type gate electrodes and exposes the third dummy gate electrodes; and replacing the third dummy gate electrodes with second type gate electrodes.

9. The method of claim 8, wherein replacing the first dummy gate electrodes with the first type gate electrodes is such that one of the first type gate electrodes is adjacent to one of the second dummy gate electrodes.

10. The method of claim 8, wherein replacing the third dummy gate electrodes with the second type gate electrodes is such that one of the second type gate electrodes is adjacent to one of the second dummy gate electrodes.

11. The method of claim 8, wherein replacing the third dummy gate electrodes with the second type gate electrodes comprises:

removing the third dummy gate electrodes to form second openings over the substrate;

removing the second mask; and forming the second type gate electrodes in the second openings.

12. The method of claim 11, wherein forming the second type gate electrodes in the second openings comprises:

forming a conductive material in the second openings; and performing a planarization process to remove a portion of the conductive material outside the second openings and expose the second dummy gate electrodes.

13. The method of claim 8, wherein the first mask comprises a first stripe covering a first group of the second dummy gate electrodes and a second stripe covering a second group of the second dummy gate electrodes, the second stripe is closer to a center of the first type region of the substrate than the first strip is to the center of the first type region of the substrate, and a width of the second stripe is greater than a width of the first stripe.

14. The method of claim 8, further comprising:

after depositing the source/drain epitaxial structure, forming a contact etch stop layer over and in contact with the source/drain epitaxial structure and the second active region of the substrate.

15. A method for manufacturing a semiconductor device comprising:

forming a first active region in a first type region of a substrate and a second active region in a second type region of the substrate such that the second type region surrounds the first type region;

forming first dummy gate electrodes and second dummy gate electrodes over the first type region of the substrate and third dummy gate electrodes over the second type region of the substrate simultaneously, wherein the second dummy gate electrodes are distributed among the first dummy gate electrodes, and a number of the first dummy gate electrodes is greater than a number of the second dummy gate electrodes;

replacing the first dummy gate electrodes with first type gate electrodes; and after replacing the first dummy gate electrodes with first type gate electrodes, replacing the second and third dummy gate electrodes with second type gate electrodes such that the second type region is free of gate electrodes having a conductivity type the same as the first type gate electrodes.

16. The method of claim 15, wherein one of the first type gate electrodes and one of the second type gate electrodes are both above the first active region.

17. The method of claim 15, wherein the first active region extends in a first direction, and the second dummy gate electrodes comprise a first group and a second group spaced apart from each other and arranged along the first direction.

18. The method of claim 17, wherein the second group is closer to a center of the first type region of the substrate than the first group is to the center of the first type region of the substrate, and a number of second dummy gate electrodes in the second group is greater than a number of second dummy gate electrodes in the first group.

19. The method of claim 15, wherein the first active region extends in a first direction, and the second dummy gate electrodes comprise a first group and a second group spaced apart from each other and arranged along a second direction perpendicular to the first direction.

20. The method of claim 19, wherein the second group is closer to a center of the first type region of the substrate than the first group is to the center of the first type region of the substrate, and a number of second dummy gate electrodes in the second group is greater than a number of second dummy gate electrodes in the first group.

\* \* \* \* \*